US006618317B1

(12) United States Patent
Tsuji et al.

(10) Patent No.: US 6,618,317 B1
(45) Date of Patent: Sep. 9, 2003

(54) WRITE SYSTEM ARCHITECTURE OF MAGNETIC MEMORY ARRAY DIVIDED INTO A PLURALITY OF MEMORY BLOCKS

(75) Inventors: Takaharu Tsuji, Hyogo (JP); Tsukasa Ooishi, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/331,492

(22) Filed: Dec. 31, 2002

(30) Foreign Application Priority Data

Mar. 19, 2002 (JP) .................................. 2002-076117
Jul. 17, 2002 (JP) .................................. 2002-208569

(51) Int. Cl.$^7$ .............................................. G11C 11/15
(52) U.S. Cl. ..................... 365/230.07; 365/230.06; 365/230.03; 365/173; 365/171
(58) Field of Search ................. 365/173, 171, 365/230.03, 230.06, 230.07, 190

(56) References Cited

U.S. PATENT DOCUMENTS

| 5,946,227 | A | * | 8/1999 | Naji | ........................... | 365/158 |
| 6,272,041 | B1 | | 8/2001 | Naji | ........................... | 365/171 |
| 6,385,083 | B1 | * | 5/2002 | Sharma et al. | ............... | 365/171 |
| 6,509,621 | B2 | * | 1/2003 | Nakao | ........................ | 257/421 |
| 6,522,581 | B2 | * | 2/2003 | Takata et al. | ........... | 365/185.05 |
| 6,532,163 | B2 | * | 3/2003 | Okazawa | ..................... | 365/97 |

OTHER PUBLICATIONS

"A 10ns Read and Write Non-Volatile Memory Array Using a Magnetic Tunnel Junction and FET Switch in Each Cell", Scheuerlein et al., ISSCC Digest of Technical Papers, TA 7.2, Feb. 2000, pp. 94–95, 128–129, 409–410.
Nonvolatile RAM based on Magnetic Tunnel Junction Elements:, Durlam et al., ISSCC Digest of Technical Papers, TA 7.3, Feb. 2000,pp. 96–97, 130–131, 410–411.
"A 256kb 3.0V 1T1MTJ Nonvolatile Magnetoresistive RAM", Naji et al., ISSCC Digest of Technical Papers, TA 7.6, Feb. 2001, pp. 94–95, 122–123, 404–405, 438.

* cited by examiner

*Primary Examiner*—Andrew Q. Tran
(74) *Attorney, Agent, or Firm*—McDermott, Will & Emery

(57) ABSTRACT

During data write, a first driver electrically connects a fist shared node to one of first and second voltages in accordance with write data. A second driver electrically connects a second shared node to the other voltage. A plurality of first switch circuits for electrically connecting one end sides of bit lines to the first shared node, respectively, and a plurality of second switch circuits for electrically connecting the other end sides to the second shared node, respectively, are provided. In accordance with a column select result, the first and second switch circuit for the corresponding bit line are turned on. Therefore, it is possible to execute a data write operation without providing a driver for each bit line.

11 Claims, 34 Drawing Sheets

FIG.11

| MEMORY BLOCK | RA ⟨2⟩ | RA ⟨1⟩ | RA ⟨0⟩ | ES ⟨0⟩ | ES ⟨1⟩ | ES ⟨2⟩ | ES ⟨3⟩ | ES ⟨4⟩ | ES ⟨5⟩ | ES ⟨6⟩ | ES ⟨7⟩ | ES ⟨8⟩ |
|---|---|---|---|---|---|---|---|---|---|---|---|---|
| MB0 | 0 | 0 | 0 | H | L | L | L | L | L | L | L | L |
| MB1 | 0 | 0 | 1 | H | H | L | L | L | L | L | L | L |
| MB2 | 0 | 1 | 0 | H | H | H | L | L | L | L | L | L |
| MB3 | 0 | 1 | 1 | H | H | H | H | L | L | L | L | L |
| MB4 | 1 | 0 | 0 | H | H | H | H | H | L | L | L | L |
| MB5 | 1 | 0 | 1 | H | H | H | H | H | H | L | L | L |
| MB6 | 1 | 1 | 0 | H | H | H | H | H | H | H | L | L |
| MB7 | 1 | 1 | 1 | H | H | H | H | H | H | H | H | L |

FIG.13

| SELECTED MEMORY BLOCK | WDT | CURRENT DIRECTION | DB | | | | | | |
|---|---|---|---|---|---|---|---|---|---|
| | | | ⟨0⟩ | ⟨1⟩ | ⟨2⟩ | ... | ⟨7⟩ | ⟨8⟩ |
| 0 | H | R→L | L | H | H | ... | H | H |
| | L | L→R | H | L | L | ... | L | L |
| 1 | H | R→L | L | L | H | ... | H | H |
| | L | L→R | H | H | L | ... | L | L |
| ... | | ... | ... | ... | ... | ... | ... | ... |
| 7 | H | R→L | L | L | L | ... | L | H |
| | L | L→R | H | H | H | ... | H | L |

FIG.16

| SELECTED MEMORY BLOCK | WDT | CURRENT DIRECTION | DB ||||||||
|---|---|---|---|---|---|---|---|---|
| | | | <0> | <1> | <2> | ... | <7> | <8> |
| 0 | H | R→L | H | L | L | ... | L | L |
| 0 | L | L→R | L | H | H | ... | H | H |
| 1 | H | R→L | H | H | L | ... | L | L |
| 1 | L | L→R | L | L | H | ... | H | H |
| ... | | ... | ... | ... | ... | ... | ... | ... |
| 7 | H | R→L | H | L | H | ... | H | L |
| 7 | L | L→R | L | L | L | ... | L | H |

WRITE SYSTEM ARCHITECTURE OF MAGNETIC MEMORY ARRAY DIVIDED INTO A PLURALITY OF MEMORY BLOCKS

BACKGROUND OF THE INVENTION

1. Field of the Invention

The present invention relates to a thin film magnetic memory device, and more particularly to a random access memory including memory cells having magnetic tunnel junctions (MTJs).

2. Description of the Background Art

As a memory capable of storing nonvolatile data with low power consumption, attention is being paid to an MRAM Magnetic Random Access Memory) device. The MRAM device is a memory which stores nonvolatile data using a plurality of thin film magnetic materials formed on a semiconductor integrated circuit and which can randomly access the respective thin film magnetic materials.

Recently, in particular, it has been made public that the performance of an MRAM device dramatically advances by employing tunnel magneto-resistive elements which are thin film magnetic materials using magnetic tunnel junctions in memory cells. The MRAM device which includes memory cells each having a magnetic tunnel junction is disclosed by technical documents such as "A 10 ns Read and Write Non-Volatile Memory Array Using a Magnetic Tunnel Junction and FET Switch in each Cell", ISSCC Digest of Technical Papers, TA7.2, Feb. 2000., "Nonvolatile RAM based on Magnetic Tunnel Junction Elements", ISSCC Digest of Technical papers, TA7.3, Feb. 2000., and "A 256 kb 3.0V 1T1MTJ Nonvolatile Magnetoresistive RAM", ISSCC Digest of Technical Papers, TA7.6, Feb. 2001.

FIG. 30 is a schematic diagram showing the configuration of a memory cell having a magnetic tunnel junction (which will be also referred to simply as "MTJ memory cell" hereinafter).

Referring to FIG. 31, each MTJ memory cell includes a tunnel magneto-resistive element TMR the electric resistance of which changes according to stored data level, and an access element ATR for forming the path of a sense current Is which passes through tunnel magneto-resistive element TMR during data read. In the following description, access element ATR will be also referred to as "access transistor ATR". Access transistor ATR is connected in series to tunnel magneto-resistive element TMR.

For each MTJ memory cell, a digit line DL for instructing data write, a word line WL for executing data read and a bit line BL which is a data line for transmitting an electrical signal corresponding to the data level of stored data during the data read and data write are arranged.

FIG. 31 is a conceptual view for describing a data read operation for reading data from a MTJ memory cell.

Referring to FIG. 30, tunnel magneto-resistive element TMR includes a ferromagnetic material layer FL which has a fixed, constant magnetization direction (which will be also referred to simply as "fixed magnetic layer" hereinafter) and a ferromagnetic material VL magnetized in a direction according to a magnetic field applied from externally (which will be also referred to simply as "free magnetization layer" hereinafter). A tunnel barrier (tunnel film) TB formed out of an insulating film is provided between fixed magnetization layer FL and free magnetization layer VL. Free magnetization layer VL is magnetized in the same direction or the opposite direction to that of fixed magnetization layer FL in accordance with the level of stored data to be written. Fixed magnetization layer FL, tunnel barrier TB and free magnetization layer VL form a magnetic tunnel junction.

During data read, access transistor ATR is turned on in response to the activation of word line WL and tunnel magneto-resistive element TMR is connected between bit line BL and a ground voltage GND. As a result, a bias voltage in accordance with a bit line voltage is applied to the both ends of tunnel magneto-resistive element TMR and a tunnel current flows in tunnel film (tunnel barrier) TB. By using such a tunnel current, it is possible to carry a sense current to the current path of bit line BL—tunnel magneto-resistive element TMR—access transistor ATR—ground voltage GND.

The electrical resistance of tunnel magneto-resistive element TMR changes according to the relative relationship between the magnetization direction of fixed magnetization layer FL and that of free magnetization layer VL. Specifically, if the magnetization direction of fixed magnetization layer FL is parallel to that of free magnetization layer VL, the electrical resistance value of tunnel magneto-resistive element TMR is a minimum value Rmin. If these magnetization directions are opposite (non-parallel) to each other, the electrical resistance value of tunnel magneto-resistive element TMR is a maximum value Rmax.

Accordingly, if free magnetization layer VL is magnetized in a direction according to stored data, a voltage change which occurs to tunnel magneto-resistive element TMR due to sense current differs according to the level of the stored data. Therefore, if sense current Is is carried to tunnel magneto-resistive element TMR after precharging bit line BL with, for example, a constant voltage, the stored data of the MTJ memory cell can be read by sensing the voltage of bit line BL.

FIG. 32 is a conceptual view for describing a data write operation for writing data to the MTJ memory cell.

Referring to FIG. 32, during data write, word line WL is deactivated and access transistor ATR is turned off. In this state, a data write current for magnetizing free magnetization layer VL in a direction according to the write data, is carried to each of digit line DL and bit line BL.

FIG. 33 is a conceptual view for describing the relationship between the data write current and the magnetization direction of tunnel magneto-resistive element TMR during data write.

Referring to FIG. 33, the horizontal axis H(EA) indicates a magnetic field applied in an easy axis (EA: Easy Axis) direction in free magnetization layer VL in tunnel magneto-resistive element TMR. The vertical axis H(HA) indicates a magnetic field applied in a hard axis (HA: Hard Axis) direction in free magnetization layer VL. Magnetic fields H(EA) and H(HA) correspond to two magnetic fields generated by currents carried to bit line BL and digit line DL, respectively.

In the MTJ memory cell, the fixed magnetization direction of fixed magnetization layer FL is along the easy axis of free magnetization layer VL. Free magnetization layer VL is magnetized in a direction parallel or non-parallel (opposite) to fixed magnetization layer FL along the easy axis direction in accordance with the level of stored data ("1" or "0"). The MTJ memory cell can store 1-bit data ("1" and "0") corresponding to the two magnetization directions of free magnetization layer VL, respectively.

The magnetization direction of free magnetization layer VL can be rewritten only if the sum of magnetic fields H(EA) and H(HA) applied to free magnetization layer VL reaches a region outside of an asteroid characteristic line shown in FIG. 33. In other words, if the data write magnetic field applied to free magnetization layer VL has an intensity corresponding to the region inside of the asteroid characteristic line, the magnetization direction of free magnetization layer VL has no change.

As shown in the asteroid characteristic line, if a magnetic field in the hard axis direction is applied to free magnetization layer VL, it is possible to decrease a magnetization threshold necessary to change the magnetization direction of free magnetization layer VL along the easy axis.

If operation points during data write are designed as shown in the example of FIG. 33, the data write magnetic field in the easy axis direction is designed so as to have an intensity of $H_{WR}$ in the MTJ memory cell to which the data is to be written. That is, the value of the data write current carried to each of bit line BL and digit line DL is designed so as to obtain this data write magnetic field $H_{WR}$. Generally, data write magnetic field $H_{WR}$ is expressed by the sum of a switching magnetic field $H_{SW}$ necessary to change over a magnetization direction and a margin $\Delta H$, i.e., $H_{WR}=H_{SR}+\Delta H$.

To rewrite the stored data of the MTJ memory cell, i.e., to rewrite the magnetization direction of tunnel magneto-resistive element TMR, it is necessary to carry a data write current at predetermined level or higher to each of digit line DL and bit line BL. By doing so, free magnetization layer VL in tunnel magneto-resistive element TMR is magnetized in the direction parallel or opposite (non-parallel) to that of fixed magnetization layer FL in accordance with the direction of the data write magnetic field along the easy axis (EA). The magnetization direction which is written to tunnel magneto-resistive element TMR once, i.e., the stored data of the MTJ memory cell is held in a nonvolatile manner until new data is written.

As described above, the electrical resistance of tunnel magneto-resistive element TMR changes according to the magnetization direction which can be rewritten by the data write magnetic field applied thereto. Therefore, if electrical resistance values Rmax and Rmin of tunnel magneto-resistive element TMR are made to correspond to the levels ("1" and "0") of the stored data, respectively, it is possible to store nonvolatile data.

FIG. 34 is a block diagram showing the configuration of a column select related circuit and a column select target memory array in an MRAM device in which MTJ memory cells are integrated and arranged in a matrix.

Referring to FIG. 34, memory array MA includes memory cells arranged in a matrix. The column select related circuit includes bit lines BL<0> to BL<n> (to be also referred to generically as "bit lines BL" hereinafter) arranged to correspond to memory cell columns included in memory array MA, respectively, write current control circuits BLCLa and BLCLb which are arranged on the both sides of memory array MA and supply data write currents to bit lines BL, respectively, current sources 600 which supply currents to write current control circuits BLCLa and BLCLb, respectively, column decoders 200a and 200b which execute column selection and transmit column selection results to column select lines CSL and CSLR, respectively.

Write current control circuit BLCLa includes a plurality of write control units BLUa provided to correspond to one end sides of bit lines BL<0> to BL<n>, respectively. Write current control circuit BLCLb includes a plurality of write control units BLUb provided to correspond to the other end sides of bit lines BL<0> to BL<n>, respectively. It is assumed herein that the one end side signifies a write current control circuit BLCLa side and the other end side signifies a write current control circuit BLCLb side. If write enable WE is active (at "H" level), column decoder 200a transmits a column select result to column select lines CSL<0> to CSL<n> (to be also referred to generically as "column select lines CSL" hereinafter) which correspond to the plurality of write control units BLUa included in write current control circuit BLCLa, respectively, in accordance with the inputs of column addresses CA<y:0> (where y is a natural number). In addition, if write enable WE is active (at "H" level), column decoder 200b transmits a column select result to column select lines CSLR<0> to CSLR<n> (to be also referred to generically as "column select lines CSLR" hereinafter) which correspond to the plurality of write control units BLUb included in write current control circuit BLCLb, respectively, in accordance with the inputs of column addresses CA<y:0> (where y is a natural number). It is noted that column addresses CA<y:0> generically express column addresses CA<0> to CA<y> of a plurality of bits. The other signals each consisting of a plurality of bits will be also expressed similarly so as to generically show the plural bits. For example, $i^{th}$ to $j^{th}$ bits of a signal SIJ will be also expressed generically by signals SIJ<i:j>. Column addresses CA<y:0> will be also referred to generically as "column addresses CA" hereinafter.

FIG. 35 is a circuit diagram showing the configuration of write control unit BLUa in detail.

Referring to FIG. 35, write control unit BLUa includes a NAND circuit 52 which outputs a NAND logic operation result for write data NWDT (an inverted signal of write data WDT) and the voltage level of column select line CSL which shows a column select result, and a P-channel MOS transistor 50 and an N-channel MOS transistor 51 which are complementarily activated in accordance with the output signal of NAND circuit 52.

In addition, write control unit BLUb has the same configuration as that of write control unit BLUa except that signal NWDT inputted into NAND circuit 52 is replaced by write data WDT as indicated in a bracket.

The operations of write control units BLUa and BLUb will be described.

Write control unit BLUa arranged on the one end side of bit line BL connects the one end side of bit line BL to a power supply voltage VCC in accordance with the activation of P-channel MOS transistor 50. Write control unit BLUb arranged on the other end side of bit line BL connects the other end side of bit line BL to ground voltage GND in accordance with the activation of N-channel MOS transistor 51. Following this, a data write current i0 is supplied from the one end side of bit line BL to the other end side thereof. On the other hand, write control unit BLUa arranged on the one end side of bit line BL connects one end side of bit line BL to ground voltage GND in accordance with activation of N-channel MOS transistor 51. Write control unit BLUb arranged on the other end side of bit line BL connects the other end side of bit line BL to power supply voltage VCC in accordance with activation of P-channel MOS transistor 50. Accordingly, a data write current i1 is supplied from the other end side of bit line BL to the one end side thereof.

Referring back to FIG. 34, it is assumed herein that data write current i0 is carried to bit line BL in a direction from write current control circuit BLCLa toward write current control circuit BLCLb. It is also assumed herein that data write current i1 is carried to bit line BL in a direction from write current control circuit BLCLb toward write current control circuit BLCLa.

FIG. 36 is a signal waveform view showing the waveforms of respective signal lines if bit line BL<0> is selected. Now, a case where data write current i0 is supplied to bit line BL<0> will be described.

At time tA at which the level of write data WDT becomes "H" level, write data WDT (at "H" level) is inputted into write current control circuit BLCLb. In addition, write data NWDT (at "L" level) which is the inverted signal of write data WDT is inputted into write current control circuit BLCLa through an inverter 30.

At time tB, write enable WE is activated (to "H" level), and column decoder 200a which is provided to correspond to write current control circuit BLCLa selectively activates column select line CSL<0> (sets column select line CSL<0> at "H" level) among column select lines CSL<0> to CSL<n> in accordance with the inputs of write enable WE and column address CA. Column decoder 200b which is provided to correspond to the other write current control circuit BLCLb selectively activates column select line CSLR<0> (sets column select line CSLR<0> at "H" level) among column select lines CSLR<0> to CSLR<n> in accordance with the inputs of write enable WE and column address CA.

Following this, two write control units BLUa and BLUb, which are arranged on the both sides of bit line BL<0> corresponding to column select lines CSL<0> and CSLR<0>, are activated, respectively. Write control unit BLUa corresponding to column select line CSL<0> connects one end side of selected bit line BL<0> to ground voltage GND. Write control unit BLUb corresponding to column select line CSLR<0> connects the other end side of selected bit line BL<0> to power supply voltage VCC. Therefore, data write current i1 is carried to selected bit line BL<0> in a direction from the other end side of bit line BL<0> toward the one end side thereof. In this way, it is possible to supply data write current i0 or i1 in the direction according to the level of write data WDT to a selected bit line as a select target.

With this configuration, however, it is necessary to provide write control units BLU each of which performs decoding in accordance with the operation result for the column select result and the data signal on the both sides of the memory array for each bit line, which disadvantageously increases the area of the circuit zone of the write current control circuit.

This disadvantage becomes conspicuous particularly for a mass storage memory array.

The reason is as follows. The highest current value which can be carried to the digit line and the bit line during data write is restricted by a wiring resistance and a power supply voltage. Therefore, if the number of memory cells connected to one bit line BL increases, the wiring resistance of the bit line increases. To avoid increasing the wiring resistance according to an increase in the length of the bit line, it is necessary to divide the memory array into a plurality of memory blocks and to divide and hierarchize the bit line. This is because it is necessary provide the write current control circuits of the same configuration as that shown in FIG. 34 on the both sides of each memory block for each memory block. As a result, the area of the circuit zone of the write related current increases. Further, during data read, it is necessary to provide a gate transistor for selecting a bit line for each bit line, which disadvantageously increases the area of the circuit zone of the read related circuit.

SUMMARY OF THE INVENTION

It is an object of the present invention to provide a thin film magnetic memory device capable of reducing areas of write system and read system circuits, and also reducing the overall circuit area even in a mass storage MRAM device.

According to one aspect of the present invention, there is provided a thin film magnetic memory device which includes: first to $N^{th}$ N memory blocks, where N is a natural number not smaller than 2; a plurality of bit lines; and first to $(N+1)^{th}$ (N+1) write control circuits. Each of the N memory blocks has a plurality of memory cells, each storing magnetically written data, arranged in a matrix, and shares columns of a plurality of memory cells. The plurality of bit lines are provided to correspond to the plurality of memory cell columns, respectively, and shared among the N memory blocks. The (N+1) write control circuits are each arranged alternately with each of the memory blocks using regions adjacent in a row direction to each of the memory blocks. Each of the (N+1) write control circuits is connected to the plurality of bit lines, and supplies a data write current to a selected bit line of the plurality of bit lines during the data write in accordance with a level of write data. If the $I^{th}$ memory block of the N memory blocks, where I is a natural number from 1 to N, is selected, each of first to $I^{th}$ write control circuits electrically connects the selected bit line to one of first and second voltages according to the write data and each of $(I+1)^{th}$ to $(N+1)^{th}$ write control circuits electrically connects the selected bit line among the plurality of bit lines to the other one of the first and second voltages according to the write data.

Therefore, the advantage of the thin film magnetic memory device of the present invention is in that with the constitution in which the memory has a mass storage capacity and divided memory blocks, it is possible to reduce the area of the overall write control circuits.

According to another aspect of the present invention, there is provided a thin film magnetic memory device which includes: first to $N^{th}$ N memory blocks where N is a natural number not smaller than 2; first to $(N+1)^{th}$ (N+1) write control circuits; first and second data lines; and first and second address decoders. Each of the N memory blocks has a plurality of memory cells, each storing magnetically written data, arranged in a matrix, and shares memory cell columns among them. Each of the memory blocks includes a plurality of bit lines provided to correspond to a plurality of memory cell columns, respectively. The (N+1) write control circuits are each arranged alternately in a column direction with each of the N memory blocks for each of the memory blocks, and each supplies a data write current to a selected bit line of the plurality of bit lines in accordance with a level of write data during data write. The first data line is arranged to be common to the odd-numbered write control circuits of the (N+1) write control circuit. The second data line is arranged to be common to the even-numbered write control circuits of the (N+1) write control circuit. The first address decoder transmits first and second data signals, complementary to each other in accordance with the write data, to the first and second data lines, respectively. Two of the write control circuits adjacent a selected memory block among the N memory blocks are selected during the data write. Each of the write control circuits includes: at least one of first and second connection control circuits and a driver. The first connection control circuit controls the connection between one end sides of the plurality of bit lines and a shared node provided for each of the write control circuits. The second connection control circuit controls the connection between the other end sides of the plurality of bit lines and the shared node in each of the memory blocks. The driver is connected to one of the first and second data lines and electrically connects the shared node to one of the first and second voltages in accordance with the one of the first and second data signals during the data write. The plurality of second address decoders are provided to correspond to the plurality of write control circuits, respectively, and each controls one of the first and second connection control circuits in accordance with a memory block select signal for selecting the selected memory block and a column select result.

According to the thin film magnetic memory device of the present invention, it is possible to share the write control circuit arranged between the two memory blocks among the two memory blocks.

Therefore, the advantage of the thin film magnetic memory device of the present invention is in that with the constitution in which the memory has a mass storage capacity and divided memory blocks, it is possible to reduce the respective write control circuits arranged alternately with the respective memory blocks as a whole and to reduce the area of the circuit zone of each write control circuit.

According to yet another aspect of the present invention, there is provided a thin film magnetic memory device which includes: a memory array; a plurality of data line pairs; a plurality of driver units; first and second connection control circuits; and an address decoder. The memory array has a plurality of memory cells, each storing magnetically written data, arranged in a matrix. The memory array includes a plurality of bit lines provided to correspond to a plurality of memory cell columns, respectively. The memory array is divided along a row direction into a plurality of block units, respectively. The plurality of data line pairs are provided to correspond to the plurality of block units, respectively. The plurality of driver units are provided to correspond to the plurality of data line pairs, respectively, and each selectively supplies a data write current to corresponding one of the data line pairs in accordance with a column select result during data write. The first connection control circuit is provided for each of the data line pairs. The second connection control circuit is provided for each of the data line pairs. Each of the data line pairs includes first and second data lines. The first connection control circuit includes a plurality of first switch circuits each controlling the connection between one end side of each bit line of the bit lines included in the corresponding block unit and the corresponding first data line. The second connection control circuit includes a plurality of second switch circuits each controlling the connection between the other end side of each of the bit lines included in the corresponding block unit and the corresponding second data line. The address decoder selectively turns on the plurality of first and second switch circuits in accordance with the column select result.

According to the thin film magnetic memory device of the present invention, the memory array is divided into a plurality of block units and connection control circuits are provided to correspond to the respective block units. Each connection control circuit controls the connection between the corresponding data line pair and each bit line included in each block unit. That is, each connection control circuit is provided with switch circuits turned on/off in accordance with the column select result to correspond to one end side and the other end side of each bit line BL, respectively. Accordingly, it is possible to supply a data write current to the selected bit line.

Therefore, the advantage of the thin film magnetic memory device of the present invention is in that since the data write operation can be executed under the control of the transistors included in each connection control circuit with the constitution of hierarchical bit lines, it is possible to greatly decrease the number of parts of each write control circuit and to reduce the area of the write control circuit.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 11 is a decoding table for select signals generated by a row decoder in accordance with the inputs of row addresses;

FIG. 13 is a decoding table for decoding signals generated by respective decoding circuits in accordance with a selected signal and write data;

FIG. 16 is a decoding table for decoding signals generated by respective decoding circuits in accordance with a select signal and write data;

DESCRIPTION OF THE PREFERRED EMBODIMENTS

Figure 1:
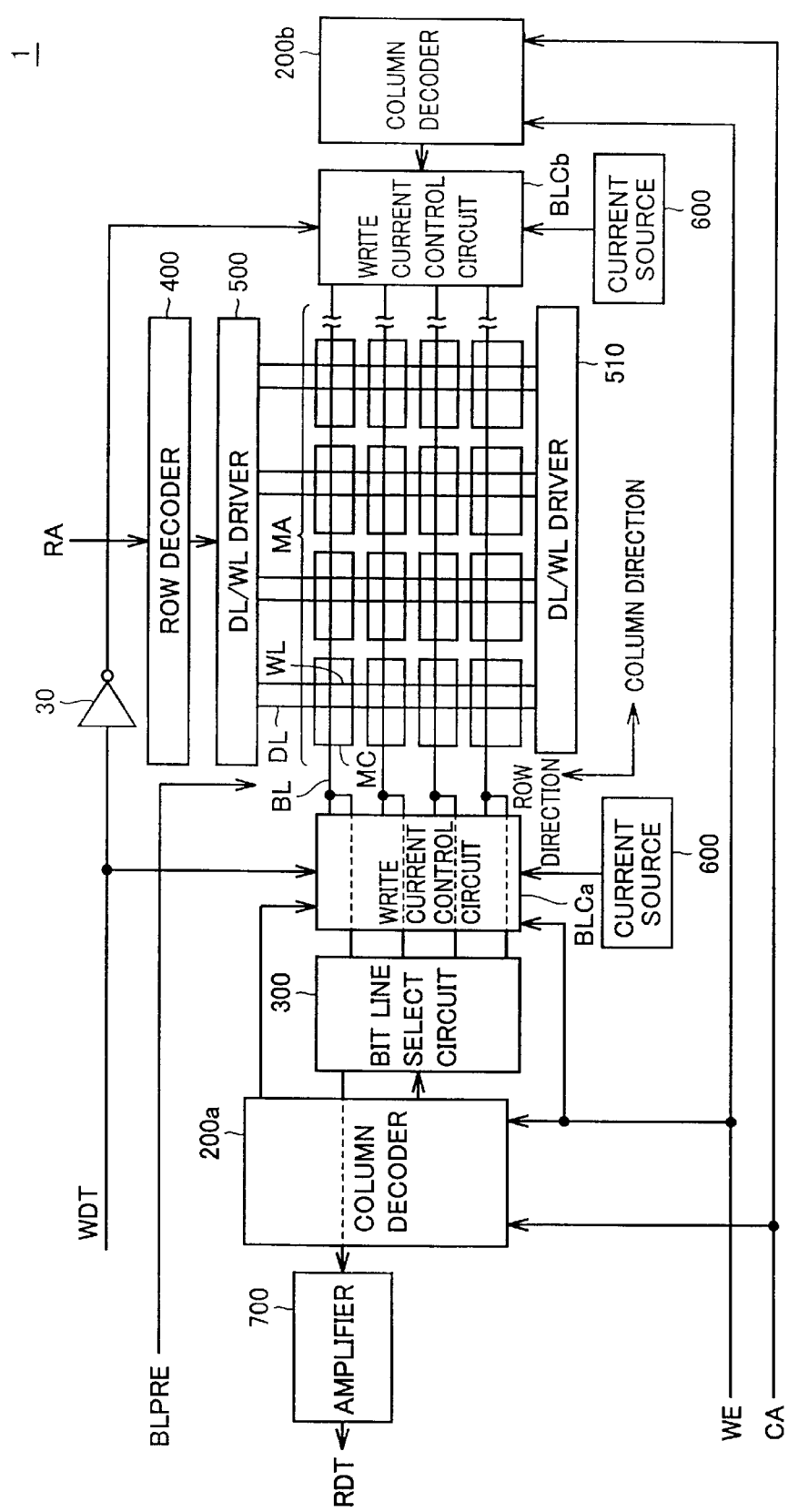
FIG. 1 is a schematic block diagram showing the entire configuration of an MRAM device according to the first embodiment of the present invention.

The embodiments of the present invention will be described hereinafter in detail with reference to the drawings. It is noted that the same or corresponding elements are denoted by the same reference symbols in the drawings, respectively and will not be repeatedly described.

First Embodiment

Referring to FIG. 1, an MRAM device 1 according to the first embodiment of the present invention includes a memory array MA which has MTJ memory cells MC arranged in a matrix. In memory array MA, a plurality of word lines WL and a plurality of digit lines DL are arranged to correspond to the rows of MTJ memory cells MC, respectively. Memory array MA is equal in configuration to the memory array shown in FIG. 34.

In addition, MRAM device 1 includes a row decoder 400 which executes row selection in accordance with a row address RA indicated by an address signal, column decoders 200a and 200b each of which executes column selection to memory array MA in accordance with column address CA indicated by an address signal if write enable WE is active, a bit line select circuit 300 which selects a bit line BL included in memory array MA in accordance with column select instructions from column decoders 200a and 200b and outputs read signals to an amplifier 700 during data write, and amplifier 700 which amplifies the signal outputted from bit line select circuit 300 and outputs the amplified signal as read data RDT.

MRAM device 1 also includes write current control circuits BLCa and BLCb which supply currents in accordance with write data WDT to bit line BL included in memory array MA in accordance with the column select instructions from column decoders 200a and 200b during data write, and current sources 600 which supply data write currents carried to bit lines BL during data write.

Further, MRAM device 1 includes DL/WL driver zones 500 and 510 each of which activates a selected word line and a selected digit line based on a row select result from row decoder 400.

In addition, write data WDT is inputted into write current control circuit BLCa, and inverted write data NWDT is inputted from an inverter 30 into write current control circuit BLCb. Further, a precharge signal BLPRE for precharging each bit line BL is inputted into write current control circuit BLCa.

Figure 2:
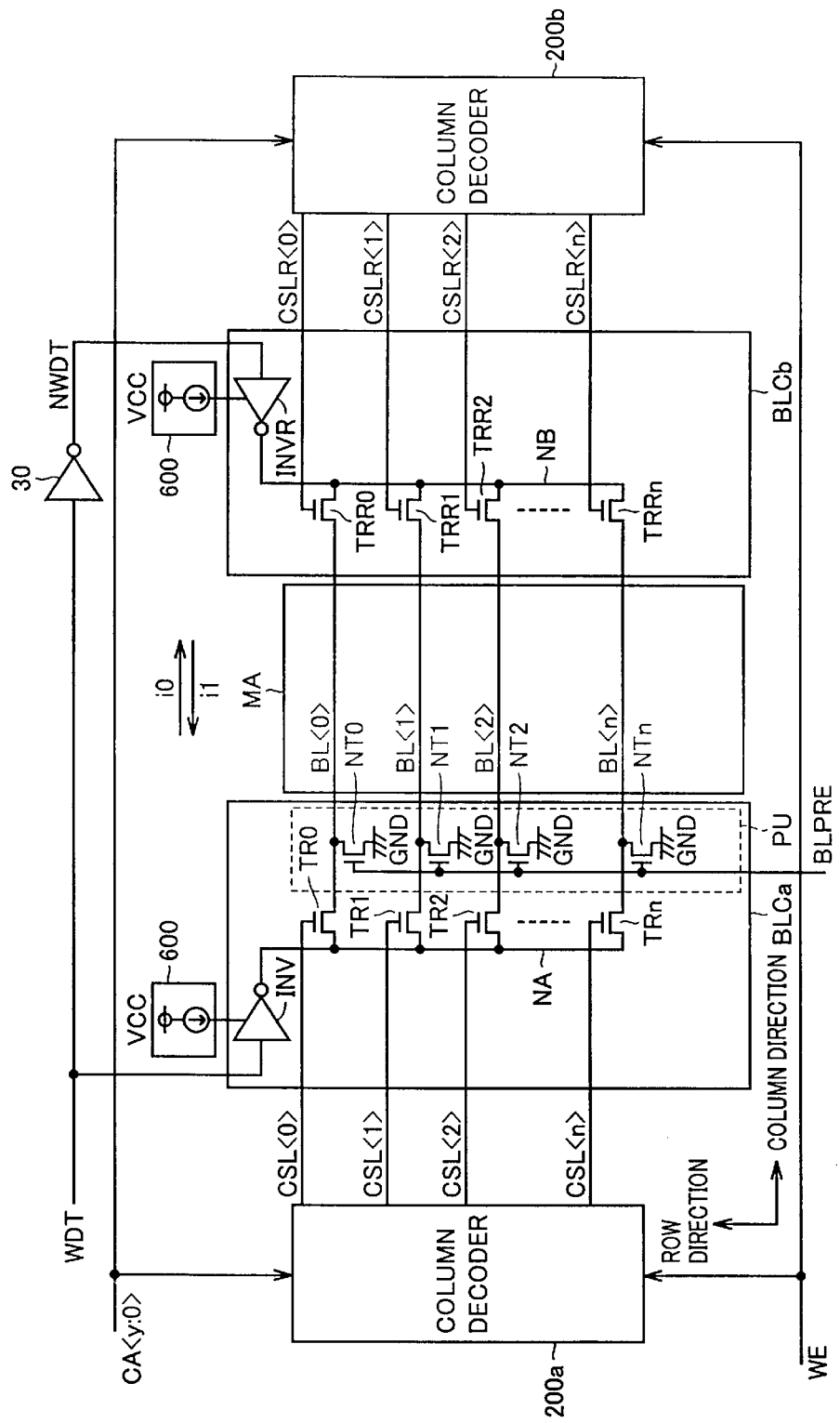
FIG. 2 is a block diagram of a column select related circuit and a column select target memory array according to the first embodiment of the present invention.

Referring to FIG. 2, memory array MA as a column select target according to the first embodiment of the present invention includes memory cells arranged in a matrix. A column select related circuit includes bit lines BL<0> to BL<n> provided to correspond to the column memory cells included in memory array MA, respectively, column decoders 200a and 200b which selectively activate column select lines CSL<0> to CSL<n> and CSLR<0> to CSLR<n> in accordance with column addresses CA, respectively, write current control circuits BLCa and BLCb which supply data write currents to bit lines BL selected in accordance with input write data WDT and NWDT, respectively, and current sources 600.

Figure 34:
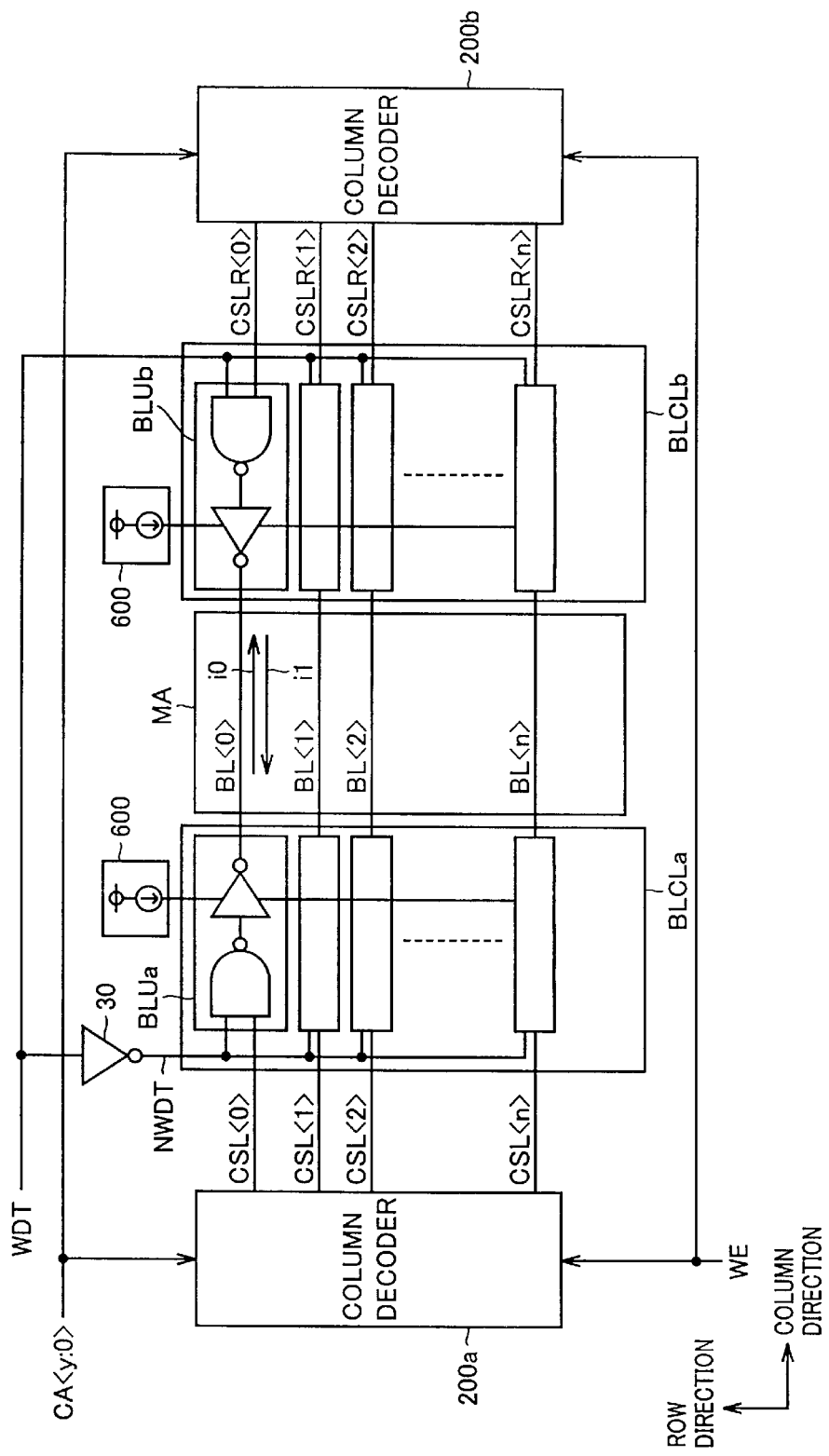
FIG. 34 is a block diagram of a column select related circuit in an MRAM device in which MJT memory cells are integrated and arranged in a matrix.
Figure 35:
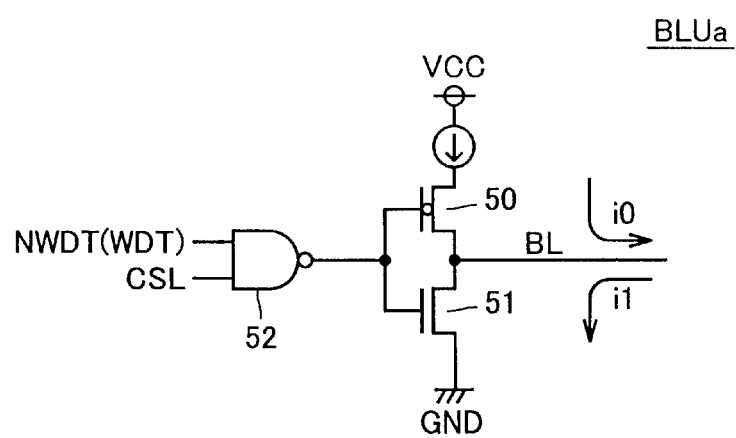
FIG. 35 is a circuit block diagram of write control unit BLUa.
Figure 36:
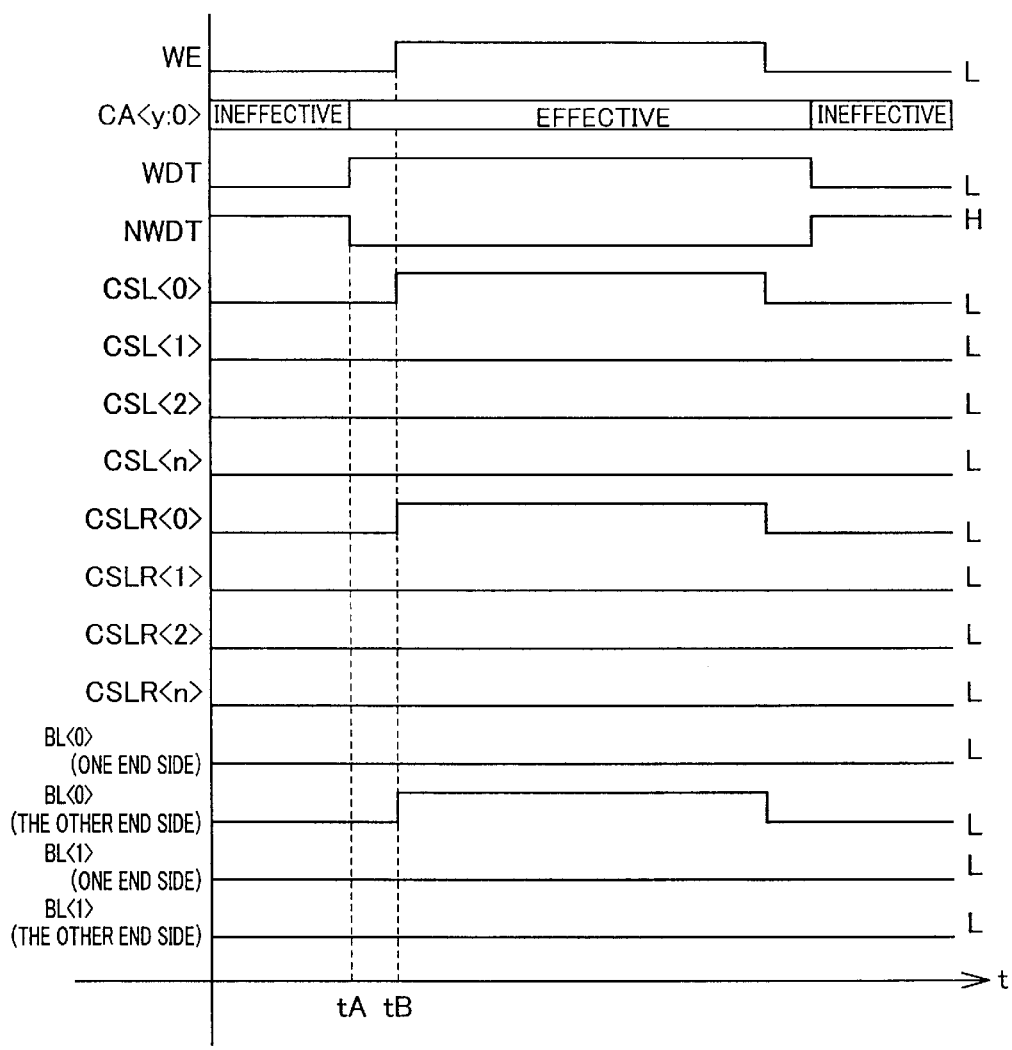
FIG. 36 is a signal waveform view showing the waveforms of respective signal lines if a bit line is selected.

This column select related circuit differs from the conventional column select related circuit shown in FIG. 34 in that write current control circuits BLCLa and BLCLb are replaced by write current control circuits BLCa and BLCb, respectively. Write data WDT is inputted into write current control circuit BLCa and inverted write data NWDT is inputted into write current control circuit BLCb through inverter 30.

Write current control circuit BLCa includes an inverter INV which electrically connects one of power supply voltage VCC and ground voltage GND to a node NA in accordance with write data WDT, N-channel MOS transistors TR0 to TRn (to be also referred to generically as "transistors TR" hereinafter) which electrically connect bit lines BL<0> to BL<n> to node NA, respectively, and a precharge unit PU which precharges bit lines BL<0> to BL<n>. The gates of transistors TR0 to TRn receive column select results of column select lines CSL<0> to CSL<n>, respectively.

Precharge unit PU includes N-channel MOS transistors NT0 to NTn which are provided to correspond to bit lines BL<0> to BL<n>, respectively. The gate of each of N-channel MOS transistors NT0 to NTn receives the input of a precharge signal BLPRE. Precharge signal BLPRE is activated while a chip is activated except for data read and data write execution periods.

Write current control circuit BLCb includes an inverter INVR which electrically connects one of power supply voltage VCC and ground voltage GND to a node NB in accordance with write data NWDT, and N-channel MOS transistors TRR0 to TRRn (to be also referred to generically as "transistors TRR" hereinafter) which electrically connect bit lines BL<0> to BL<n> to node NB, respectively. The gates of transistors TRR0 to TRRn receive column select results of column select lines CSLR<0> to CSLR<n>, respectively.

Figure 3:
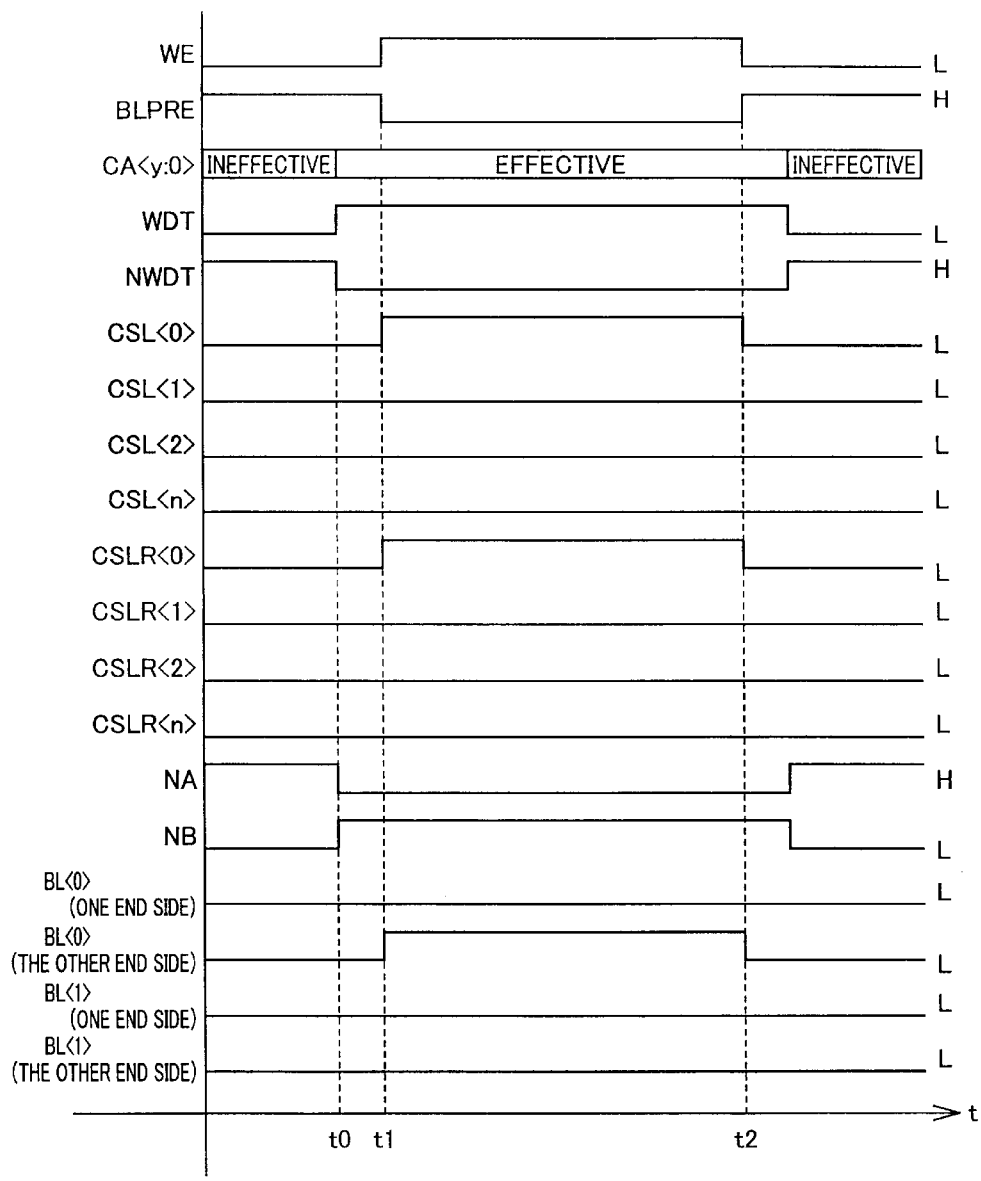
FIG. 3 is a signal waveform view showing the waveforms of respective signal lines during data write if a bit line is selected.

Referring to FIG. 3, a data write operation in a case where bit line BL<0> is selected will be described.

Referring to FIGS. 2 and 3, at time t0 before executing data write, write data WDT is set at "H" level: As a result, the write data at "H" level is inputted into write current control circuit BLCa and write data NWDT at "L" level inverted by inverter 30 is inputted into write current control circuit BCLb. Inverters INV and INVR drive nodes NA and NB at voltages according to write data WDT and inverted write data NWDT, respectively. Accordingly, inverter INV connects node NA to ground voltage GND and thereby sets the voltage level of node NA at "L" level. Inverter INVR connects node NB to power supply voltage VCC and thereby sets the voltage level of node NB at "H" level.

It is noted that write enable WE which shows execution of data write is at "L" level before time t1. Therefore, before time t1, precharge signal BLPRE is set at "H" level. Accordingly, each bit line BL is electrically connected to ground voltage GND and set in a precharged state. At time t1, write enable WE is set at "H" level. Therefore, precharge signal BLPRE is set at "L" level to thereby finish precharge.

At time t1 at which write enable WE is activated (to "H" level), column decoder 200a corresponding to write current control circuit BLCa selects column select line CSL<0> from among column select lines CSL<0> to CSL<n> in accordance with column address CA. In addition, column decoder 200b corresponding to write current control circuit BLCb selects column select line CSLR<0> from among column select lines CSLR<0> to CSL<n> in accordance with column address CA while write enable WE is activated.

In response to the selection of column select lines CSL<0> and CSLR<0>, write current control circuits BLCa and BLCb turn on corresponding transistors TR0 and TRR0, respectively. The other end side of bit line BL<0> selected accordingly is set at "H" level and one end side of selected bit line BL<0> is set at "L" level. As a result, data write current i1 is carried to selected bit line BL<0> in a direction from write current control circuit BLCb toward write current control circuit BLCa.

It is, therefore, possible to write stored data to the memory cell corresponding to selected bit line BL<0> in accordance with the level of the write data.

At time t2 at which the level of write enable WE becomes "L" level, column select lines CSL<0> and CSLR<0> are deactivated. Accordingly, the level of precharge signal BLPRE becomes "H" level. Each bit line BL is precharged to "L" level to prepare for the next operation cycle. Therefore, before time t1 at which data write is executed, each bit line BL is precharged to "L" level corresponding to ground voltage GND. At time t1, precharge is finished. It is thus possible to supply data write current i0 or i1 in the direction according to the level of write data WDT to a select target bit line.

With this configuration, nodes NA and NB provided on the both sides of respective bit lines are shared among bit lines BL and these shared nodes NA and NB (to be also referred to as "shared nodes NA and NB" hereinafter) are complementarily driven at power supply voltage VCC or ground voltage GND in accordance with write data WDT.

Therefore, with this configuration, there is no need to provide the write control units, shown in FIG. 34, which are provided to correspond to the both ends of respective bit lines BL and each of which functions to decode the write data and the column select result. That is, it suffices to provide one transistor gate which is arranged to each of the both sides of each bit line BL and is turned on and off in accordance with a column select result, in each write current control circuit. This configuration makes it possible to greatly decrease the number of parts of each write current control circuit from that of the conventional write control circuit and to thereby decrease circuit area.

In the first embodiment, the configuration in which inverters INV and INVR which supply data write currents to shared nodes NA and NB are arranged in write current control circuits BLCa and BLCb, respectively, has been described by way of example. Alternatively, inverters INV and INVR may be arranged outside of write current control circuits BLCa and BLCb. In addition, the configuration in which N-channel MOS transistors TR (TRR) are employed as transistors which constitute the gate has been described in the first embodiment. Alternatively, P-channel MOS transistors may be employed in place of N-channel MOS transistors, respectively and the inverted signal of the signal applied to the N-channel MOS transistors may be applied to the gate so as to make the configuration of the gate equal to that of the gate in the first embodiment.

First Modification of First Embodiment

Figure 4:
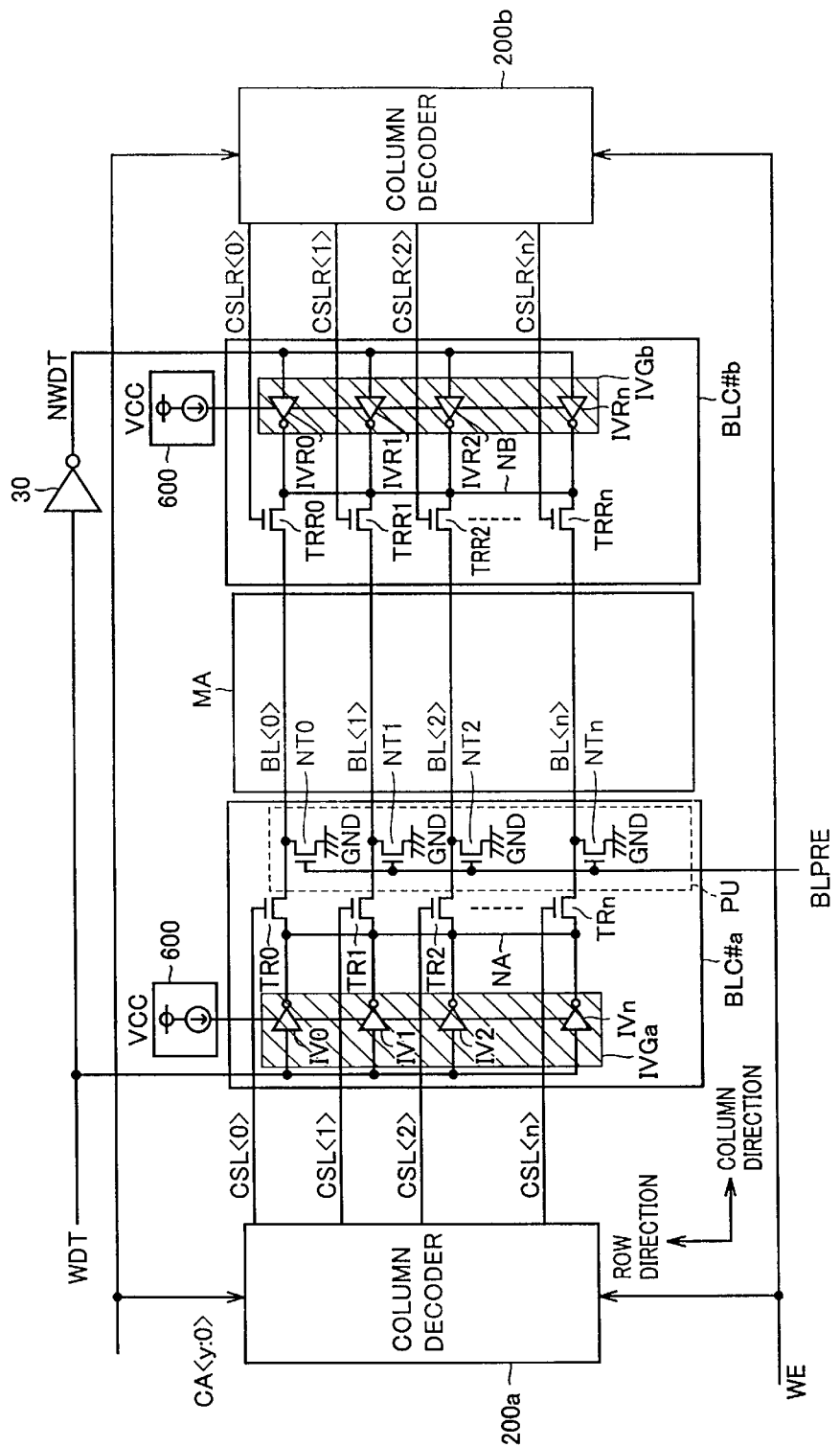
FIG. 4 is a circuit block diagram of a column select related circuit according to the first modification of the first embodiment of the present invention.

Referring to FIG. 4, a column select related circuit according to the first modification of the first embodiment of the present invention differs from the column select related circuit in the first embodiment shown in FIG. 2 in that write current control circuits BLCa and BLCb are replaced by write current control circuits BLC#a and BLC#b, respectively. Since the other configuration of the column select related circuit is the same as that in the first embodiment, it will not be repeatedly described herein in detail.

In write current control circuit BLC#a, inverter group IVGa having inverters IV0 to IVn is arranged in place of inverter INV which is arranged in write current control circuit BLCa.

Inverters IV0 to IVn are provided to correspond to bit lines BL<0> to BL<n>, respectively and electrically connect one of power supply voltage VCC and ground voltage GND to shared node NA in accordance with write data WDT.

Likewise, in write current control circuit BLC#b, inverter group IVGb having inverters IVR0 to IVRn is arranged in place of inverter INVR which is arranged in write current control circuit BLCa. Inverters IVR0 to IVRn electrically connect one of power supply voltage VCC and ground voltage GND to shared node NB in accordance with write data NWDT.

While the first modification of the first embodiment has the configuration in which the inverter described in the first embodiment is arranged to be distributed, the circuit operation thereof is the same as that in the first embodiment. Specifically, inverters IV0 to IVn of inverter group IVGa which serve as drivers in accordance with write data WDT operates similarly to inverter INV shown in FIG. 2. In addition, inverters IVR0 to IVRn of inverter group IVGb in accordance with write data NWDT operates similarly to inverter INVR shown in FIG. 2.

With this configuration, it suffices that inverters IV0 to IVn have an equal current supply force to that of inverter INV, so that it is possible make these (N+1) inverters small in size and arrange them efficiently. It is thereby possible to make the circuit area smaller than that in the configuration of the first embodiment.

Second Modification of First Embodiment

Figure 5:
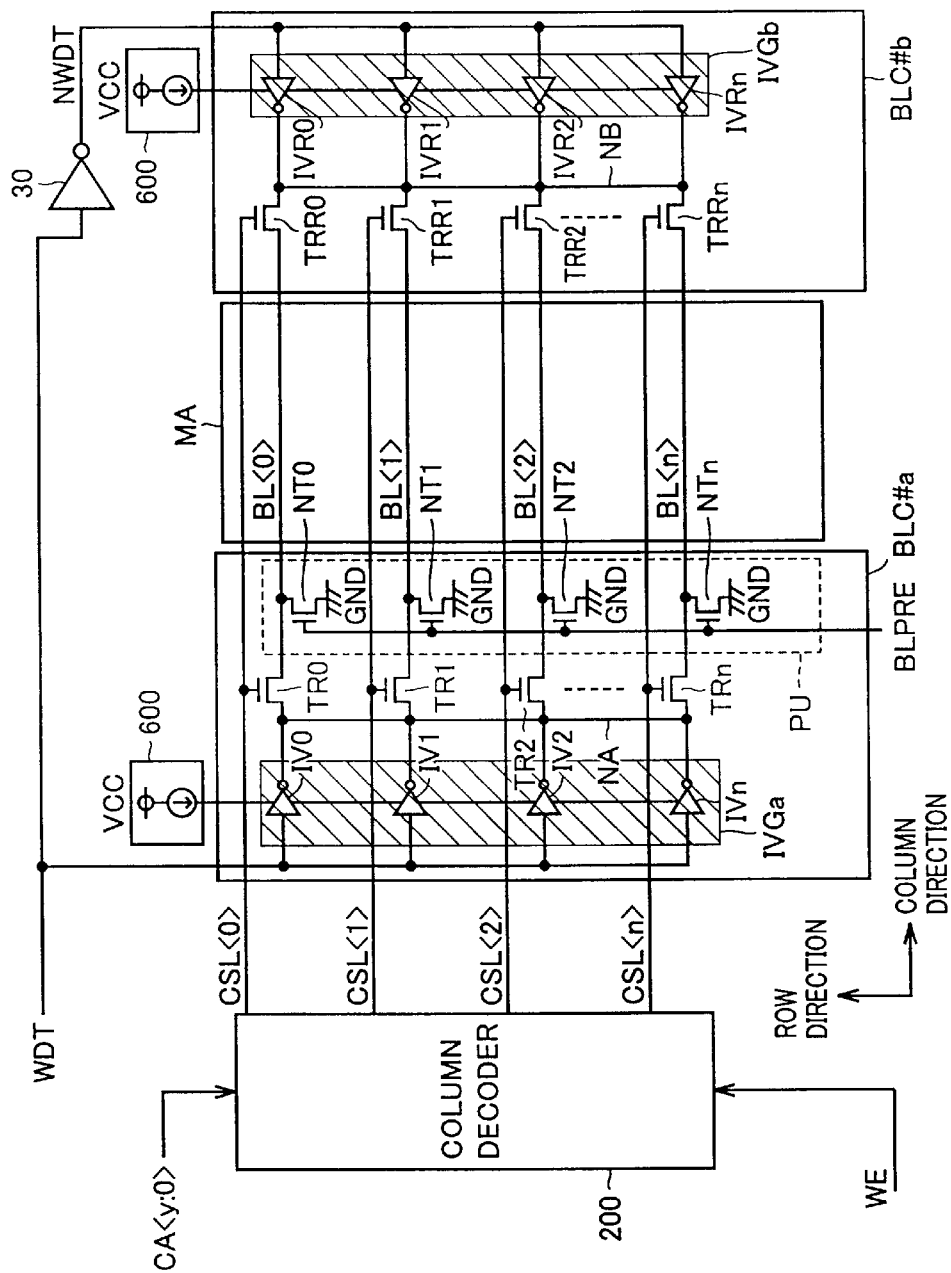
FIG. 5 is a circuit block diagram of a column select related circuit according to the second modification of the first embodiment of the present invention.

Referring to FIG. 5, a column select related circuit according to the second modification of the first embodiment of the present invention differs from that according to the first modification of the first embodiment in that a column decoder 200 is arranged only on one side. Further, column select lines CSL<0> to CSL<n> are arranged to stride over memory array MA and connected to the gates of transistors TR and TRR arranged on one end sides and the other end sides of corresponding bit lines BL, respectively. Since the other configuration is the same as that of the first modification of the first embodiment shown in FIG. 4, it will not be repeatedly described herein.

Namely, with this configuration, one column decoder 200 on/off controls transistors TR and TRR included in write current control circuits BLC#a and BLC#b, respectively.

This configuration makes it possible to share column select lines CSL between write current control circuits BLC#a and BLC#b and to thereby decrease the number of column select lines.

Further, since decoder 200 is arranged only on one side, the area of the decoder zone can be reduced. It is, therefore, possible to make the area of the entire column select related circuit smaller than that of the column select related circuit according to the first modification of the first embodiment.

Second Embodiment

Application of the present invention to the configuration of a memory array divided into a plurality of memory blocks in accordance with mass storage will be described in the second embodiment of the present invention.

Figure 6:
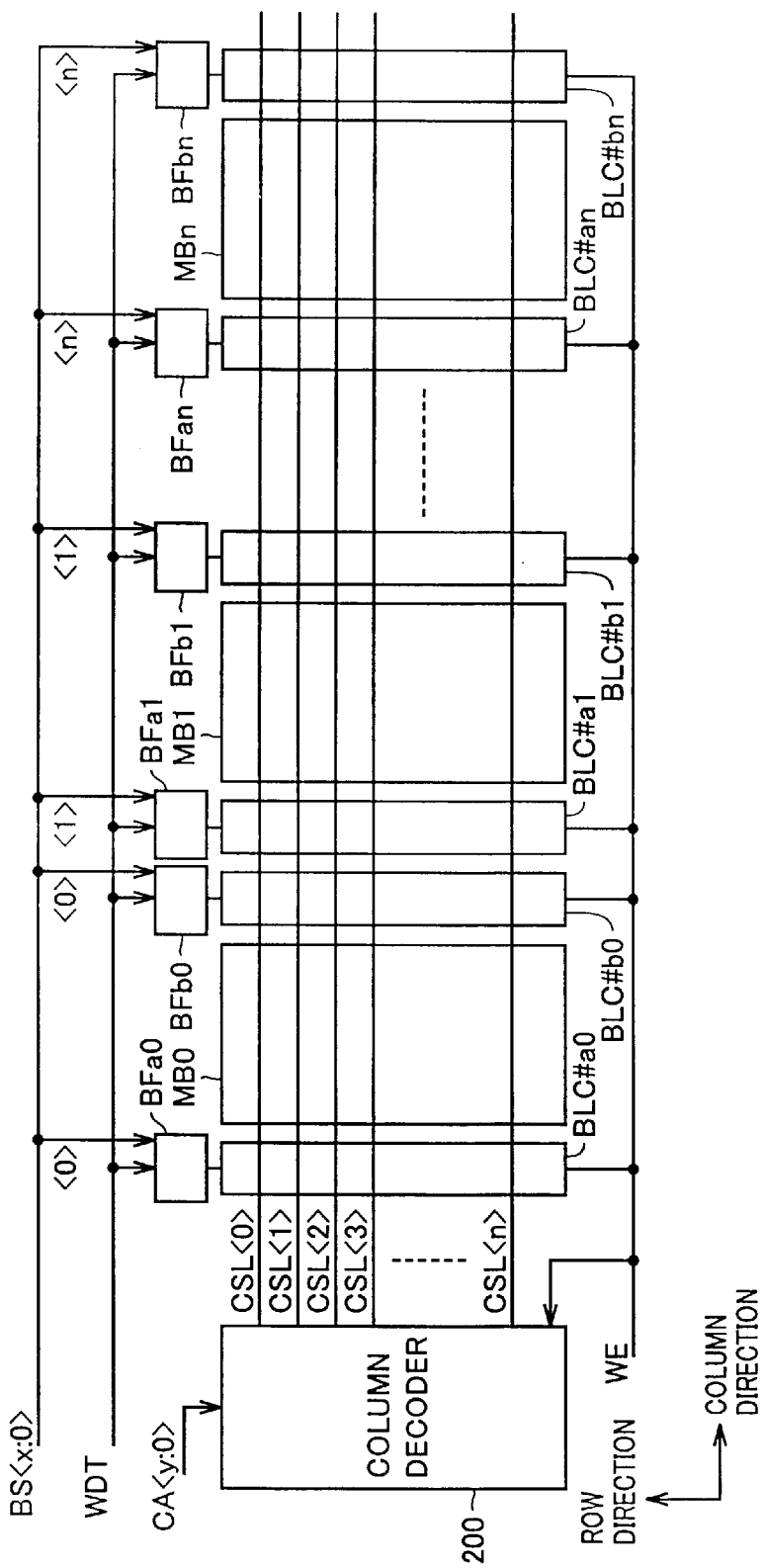
FIG. 6 is a circuit block diagram of a column select related circuit according to the second embodiment of the present invention.

Referring to FIG. 6, memory blocks MB0 to MBn (to be also referred to generically as "memory blocks MB" hereinafter each including memory cells arranged in a matrix are provided in a column direction.

A column select related circuit according to the second embodiment includes write current control circuits BLC#a0 to BLC#an (to be also referred to generically as "write current control circuits "BLC#a" hereinafter) which are provided to one sides of memory blocks MB0 to MBn, respectively, write current control circuits BLC#b0 to BLC#bn (to be also referred to generically as "write current control circuits "BLC#b" hereinafter) which are provided to the other sides of memory blocks MB0 to MBn, respectively, decoding circuits BFa0 to BFan (to be also referred to generically as "decoding circuits "BFa" hereinafter) which are provided to correspond to write current control circuits BLC#a0 to BLC#an, respectively, decoding circuits BFb0 to BFbn (to be also referred to generically as "decoding circuits "BFb" hereinafter) which are provided to correspond to write current control circuits BLC#b0 to BLC#bn, respectively, and shared column select lines CSL<0> to CSL<n> which transmit column select results to N memory blocks MB.

Figure 7:
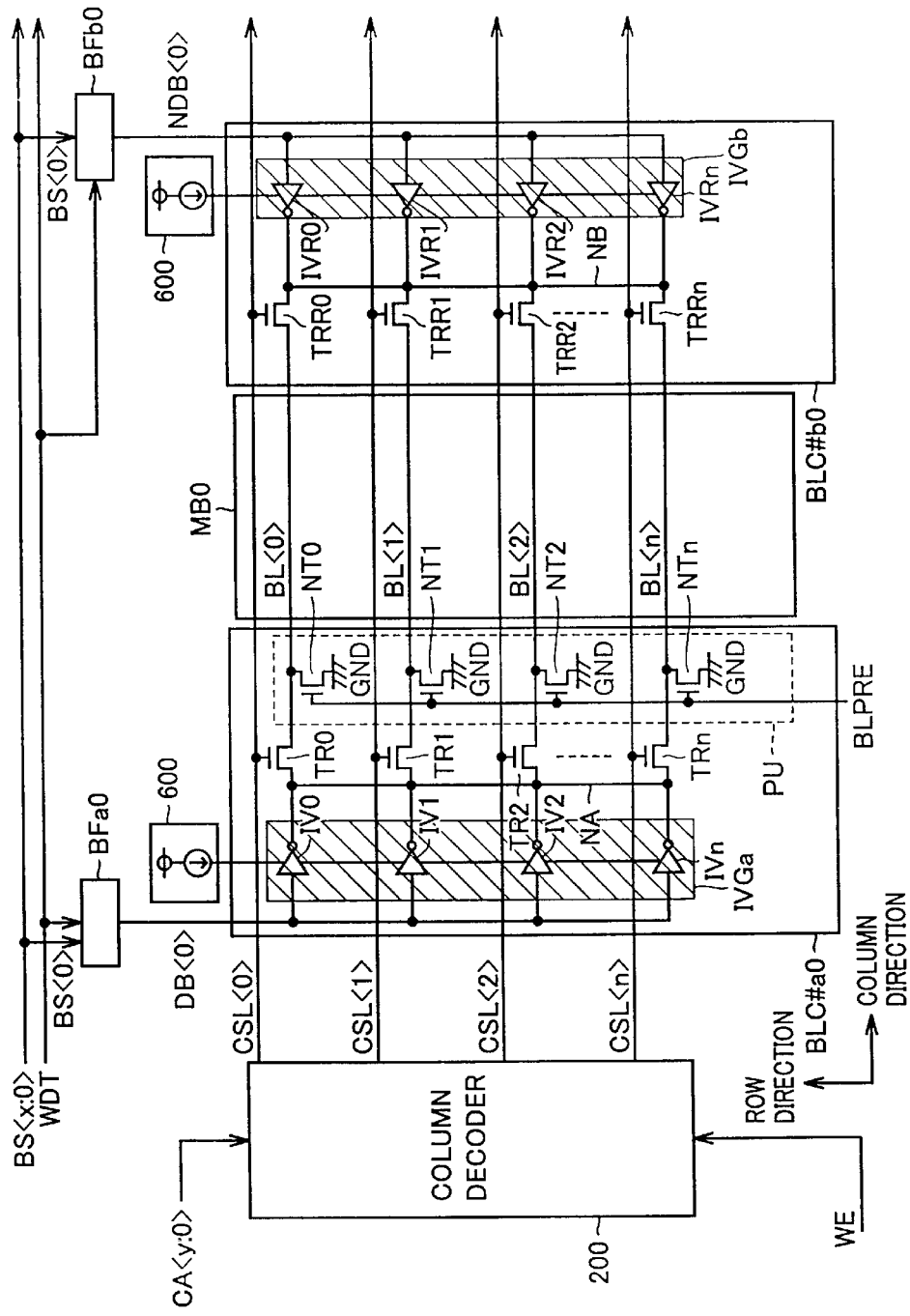
FIG. 7 is a circuit block diagram of the peripheral region of a memory block in a row select related circuit.

Referring to FIG. 7, the column select related circuit in this embodiment differs in configuration from that shown in FIG. 4 in that decoding circuits BFa0 and BFb0 are provided to correspond to write current control circuits BLC#a0 and BLC#b0, respectively.

Decoding circuits BFa0 and BFb0 input decoding signals which are decoding results, into write current control circuits BLC#a0 and BLC#b0 in accordance with write data WDT and block select signals BS, respectively.

Since write current control circuits BLC#a0 and BLC#b0 are the same in configuration as write current control circuits BLC#0 and BLC#0 shown in FIG. 4, respectively, they will not be repeatedly described herein.

Figure 8A:
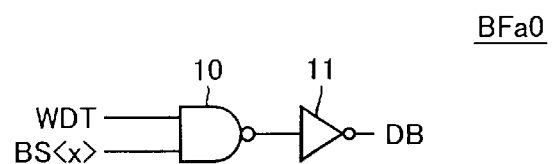
FIGS. 8A and 8B are circuit block diagrams of decoding circuits, respectively.

Referring to FIG. 8A, decoding circuit BFa0 includes a NAND circuit 10 which outputs a NAND logic operation result in accordance with the inputs of write data WDT and block select signal BS, and an inverter 11 which outputs the inverted signal of the output signal of NAND circuit 10 as a decoding signal DB. The other decoding circuits BFa are the same in configuration as decoding circuit BFa0.

Figure 8B:
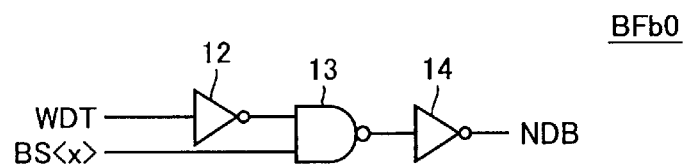

Referring to FIG. 8B, decoding circuit BFb0 includes a NAND circuit 13 which outputs a NAND logic operation result in accordance with the input of the inverted signal of write data WDT through an inverter 12 and block select signal BS, and an inverter 14 which outputs the inverted signal of the output signal of NAND circuit 13 as a decoding signal NDB. The other decoding circuits BFb are the same in configuration as decoding circuit BFb0.

If corresponding memory block MB is selected, decoding circuits BFa and BFb complementarily set decoding signals DB and NDB at "H" level and "L" level or "L" level and "L" level in accordance with write data, respectively. If corresponding memory block MB is unselected, decoding circuits BFa and BFb set decoding signals DB and NDB at "L" level.

Figure 9:
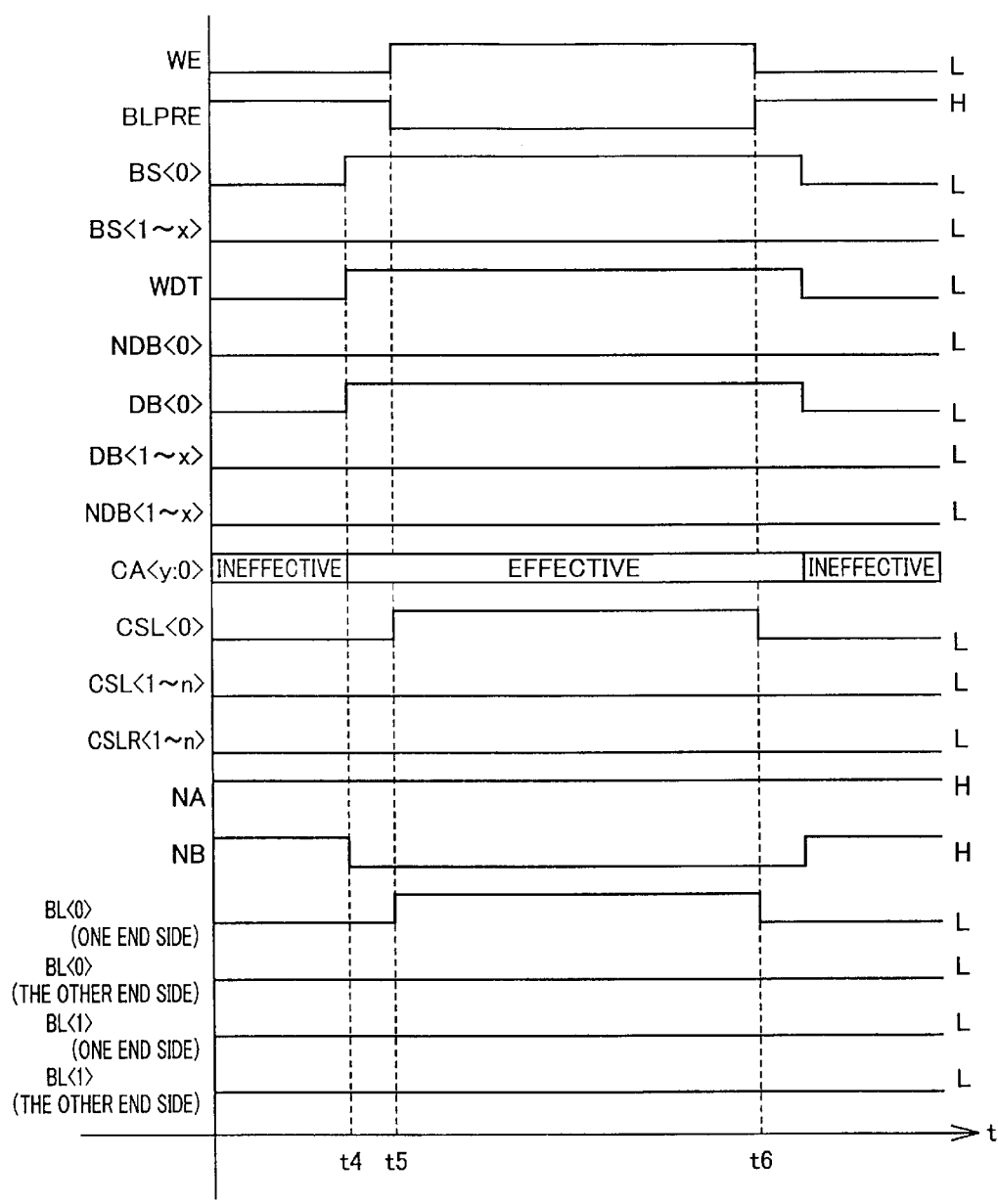
FIG. 9 is a signal waveform view showing the waveforms of respective signal lines if a memory block is selected and a data write current is carried to the selected memory block.

Referring to FIG. 9, data write operation for writing data to bit line BL<0> if memory block MB0 is selected will be described.

At time t4 before executing data write, write data WDT is set at "H" level. Write data WDT (at "H" level) and block select signal BS<0> (at "H" level) are inputted into each of decoding circuits BFa0 and BFb0. Accordingly, decoding circuit BFa0 sets decoding signal DB<0> at "H" level. Decoding circuit BFb0 sets decoding signal NDB<0> at "L" level. Therefore, respective inverters IV, which serve as drivers, of write current control circuit BLC#a0 electrically connect shared node NA to ground voltage GND in accordance with the input of decoding signal DB<0> (at "H" level). Respective inverters IVR, which serve as drivers, of write current control circuit BLC#b0 electrically connect shared node NB to power supply voltage VCC in accordance with the input of decoding signal NDB<0> (at "L" level). That is, shared node NA is set at "L" level and shared node NB is set at "H" level. It is noted that the level of write enable WE becomes "H" level at time t5.

At time t5, if write enable WE is activated, column decoder 200 selects column select line CSL<0> from among column select lines CSL<0> to CSL<n> in accordance with column address CA. Before time t5 at which the data write operation starts, precharge signal BLPRE is set at "H" level. Therefore, before time t5, each bit line BL is precharged to "L" level corresponding to ground voltage GND and at time t5, the precharge is finished.

Corresponding transistors TR0 and TRR0 are turned on in accordance with the selection of column select line CSL<0>. Accordingly, the other end side of selected bit line BL<0> is set at "H" level and one end side thereof is set at "L" level. As a result, data write current i1 is carried to selected bit line BL<0> in a direction from write current control circuit BLC#b0 toward write current control circuit BLC#a0.

Next, at time t6, the level of write enable becomes "L" level and that of the column select result ("H" level) transmitted to column select line CSL<0> becomes "L" level. In addition, the level of precharge signal BLPRE becomes "H" level and each bit line BL is precharged to "L" level to prepare for the next cycle. It is thus possible to write data to selected memory block MB.

With this configuration, even if a memory is a mass storage memory and divided into a plurality of memory blocks, it is possible to make each write current control circuit small in size similarly to the first embodiment. Further, since column decoder 200 can be shared among respective memory blocks MB, it is possible to further reduce the area of the entire column select related circuit.

Third Embodiment

The third embodiment of the present invention is intended to reduce the area of a column select related circuit by constituting each write current control circuit to be able to be shared between adjacent memory blocks.

Figure 10:
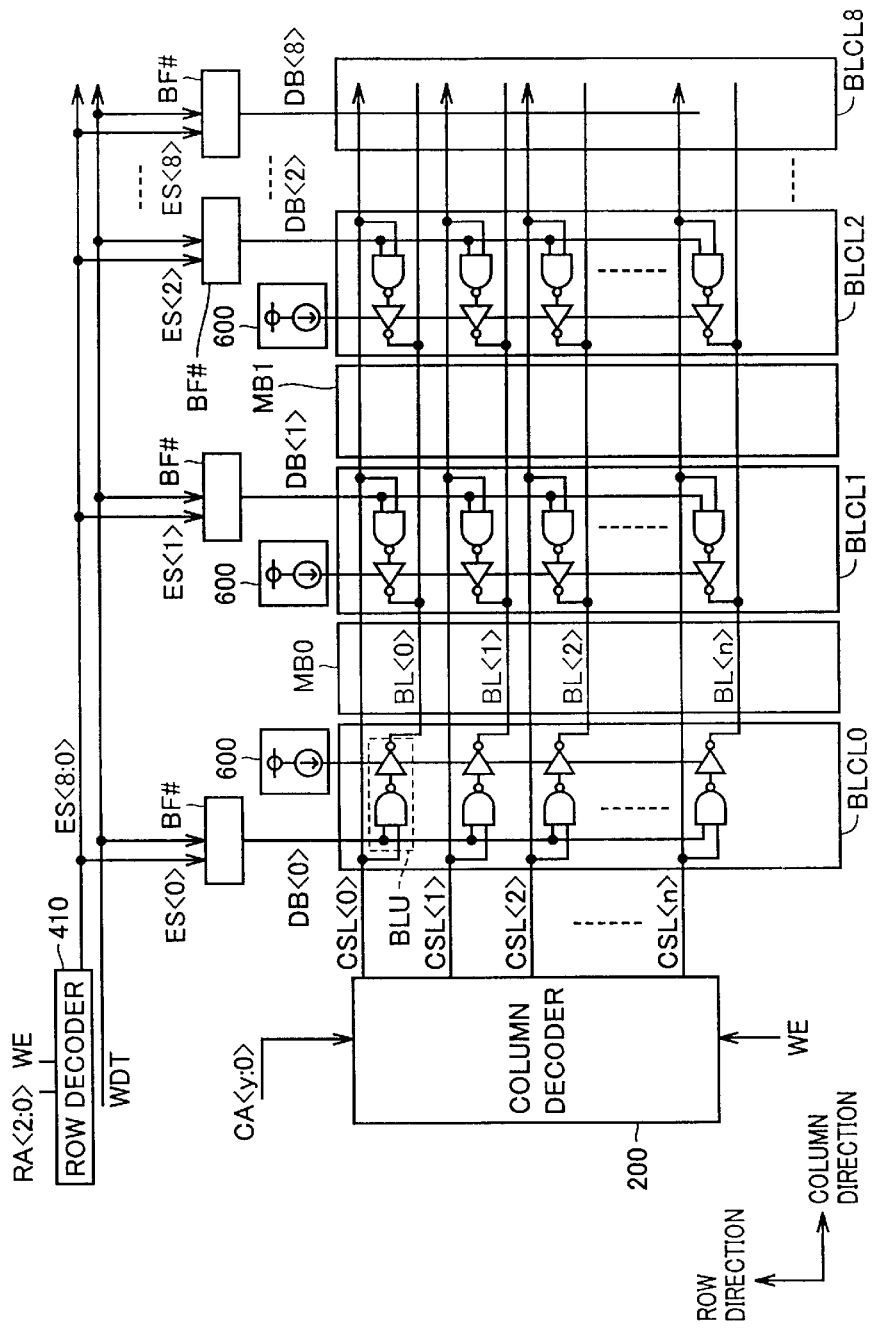
FIG. 10 is a circuit block diagram of a column select related circuit according to the third embodiment of the present invention.

Referring to FIG. 10, in the column select related circuit according to the third embodiment, the memory array is divided into eight memory blocks MB0 to MB7 in a column direction. In addition, the column select related circuit includes nine write current control circuits BLCL0 to BLCL8 (to be also referred to generically as "write current control circuits BLCL" hereinafter) which are arranged on both sides of respective memory blocks MB. Namely, memory blocks MB0 to MB7 are arranged between adjacent write current control circuits BLCL0 to BLCL8, respectively. In addition, decoding circuits BF# are provided to correspond to respective write current control circuits BLCL.

While the memory array is divided into a plurality of memory blocks, bit lines BL<0> to BL<n> are not divided and one bit line BL is shared among memory blocks MB0 to MB7 to correspond to each column. Each bit line BL is connected to write current control circuits BLCL0 to BLCL8.

Each write current control circuit BLCL includes a plurality of write control units BLU, which are provided to correspond to bit lines BL, respectively. In addition, each write control unit BLU includes a NAND circuit and an inverter and supplies a data write current to corresponding bit line BL in accordance with the inputs of corresponding column select line CSL and decoding signal DB.

Further, a row decoder 410 generates a select signal ES for selecting a write current control circuit in response to the inputs of row addresses RA<2:0> and write enable WE.

As shown in FIG. 11, in row decoder 410, select signals ES<0> to ES<8> (to be also referred to generically as "select signals ES" hereinafter) each of which selects one of memory blocks MB0 to MB7 in accordance with the combination of the inputs of row addresses <2:0> of 3 bits, are generated.

Figure 12:
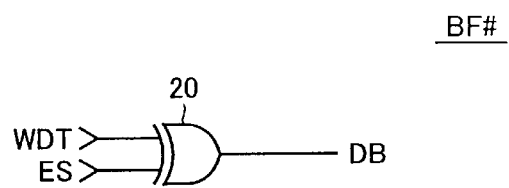
FIG. 12 is a circuit block diagram of the decoding circuit.

Referring to FIG. 12, decoding circuit BF# includes an exclusive OR circuit 20. Exclusive OR circuit 20 receives the inputs of write data WDT and select signal ES, and outputs an exclusive OR logical operation result as decoding signal DB.

Referring to FIG. 13, each decoding signal DB which is generated to supply a data write current in accordance with the input of write data WDT to selected memory block MB in accordance with row addresses RA shown in FIG. 11 is shown. Decoding signals DB<0> to DB<8> will be also referred to generically as "decoding signals DB" hereinafter.

Data write operation in the third embodiment of the present invention will be described.

By way of example, an operation for writing write data WDT at "H" level to memory cells corresponding to leading bit line BL<0> in memory block MB1 will be described.

Referring to FIGS. 10 to 13, row decoder 410 first sets both of select signals ES<1> and ES<0> corresponding to selected memory block MB1 and memory block MB0 which is located on column decoder 200 side relative to selected memory block MB1, respectively, at "H" level. The other select signals ES<2> to ES<8> are all set at "L" level.

Next, if write data WDT (at "H" level) is inputted, each decoding circuit BF# sets both decoding signals DB<0> and DB<1> at "L" level and sets decoding signals DB<2> to DB<8> all at "H" level. In addition, column decoder 200 activates column select line CSL<0> (to "H" level) in accordance with column address CA.

Accordingly, in write current control circuit BLCL0, write control unit BLU corresponding to column select line CSL<0> electrically connects shared bit line BL<0> according to inputted decoding signal DB<0> and the column select result, to ground voltage GND.

In write current control circuit BLCL1, write control unit BLU corresponding to column select line CSL<0> electrically connects shared bit line BL<0> according to inputted decoding signal DB<1> and the column select result, to ground voltage GND.

Further, in each of write current control circuits BLCL2 to BLCL8, write control unit BLU corresponding to column select line CSL<0> electrically connects shared bit line BL<0> to power supply voltage VCC.

If so, no current is carried to shared bit BL<0> in the region corresponding to memory block MB0 while data write current i1 is supplied to shared bit BL<0> in the region corresponding to memory block MB1 in a direction from write current control circuit BLCL2 toward write current control circuit BLCL1. In memory block MB1, therefore, it is possible to write "H"-level write data to the memory cells corresponding to bit line BL<0>.

Similarly, if the other memory block is selected and data write current i1 is supplied to selected bit line BL of selected memory block MB, then shared bit line BL up to the region corresponding to selected memory block MB is connected to ground voltage GND by each write current control circuit BLCL and shared bit BL in the regions after that corresponding to the selected memory block is electrically connected to power supply voltage VCC by each write current control circuit BLCL. By doing so, it is possible to supply a data write current only to the selected memory block. For example, if the $I^{th}$ (where I is 0 to 7) memory block is selected and a data write current is supplied to the bit line in the $I^{th}$ memory block, a shared bit line is connected to ground voltage GND by each of the $0^{th}$ to $I^{th}$ write current control circuits and the bit line is connected to power supply voltage VCC by each of the $(I+1)^{th}$ to last $(7^{th})$ write current control circuits.

It is, therefore, possible to share each write current control circuit between the adjacent memory blocks and to thereby reduce the circuit area of the entire write current control circuits, compared with the second embodiment.

First Modification of Third Embodiment

Figure 14:
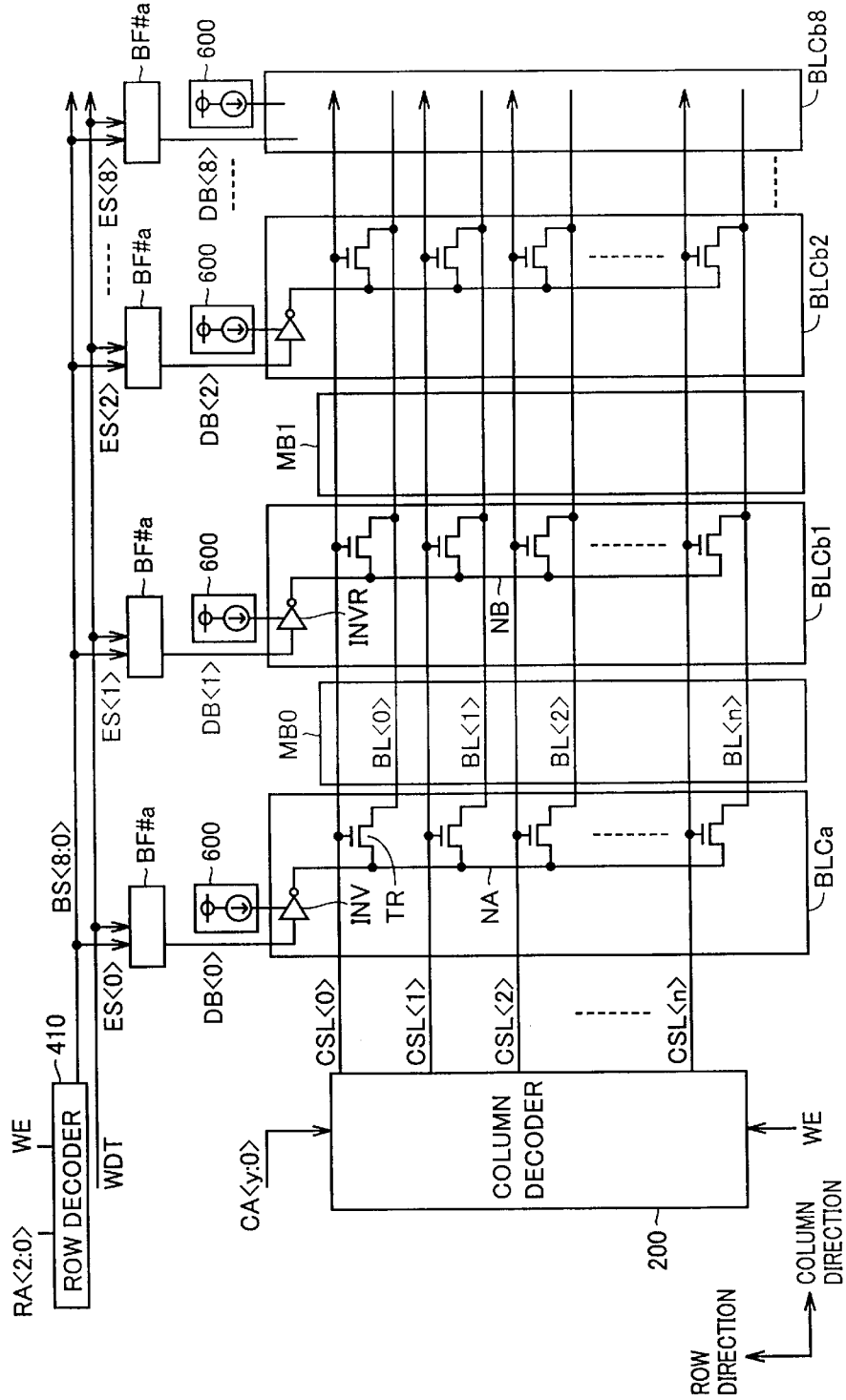
FIG. 14 is a circuit block diagram of a column select related circuit according to the first modification of the third embodiment of the present invention.

A column select related circuit according to the first modification of the third embodiment shown in FIG. 14 differs from that shown in FIG. 10 in that write current control circuit BLCL0 is replaced by a write current control circuit BLCa and the other write current control circuits BLCL1 to BLCL8 by write current control circuits BLCb1 to BLCb8. Each of write current control circuits BLCb1 to BLCb8 is the same in configuration as write current control circuit BLCb shown in FIG. 2. Further, the column select related circuit according to the first modification of the third embodiment differs from that shown in FIG. 10 in that decoding circuits BF# are replaced by decoding circuits BF#a, respectively. Since the other configuration is the same as that shown in FIG. 10, it will not be repeatedly described herein in detail.

It is noted that write current control circuit BLCa includes precharge unit PU which will be not shown in the figure.

Figure 15:
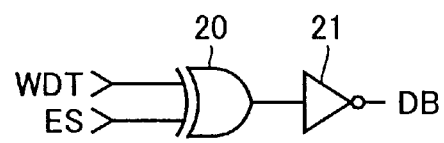
FIG. 15 is a circuit block diagram of a decoding circuit.

Referring to FIG. 15, decoding circuit BF#a includes exclusive OR circuit 20 and an inverter 21. Decoding circuit BF#a differs from decoding circuit BF# shown in FIG. 12 by further providing inverter 21. Namely, exclusive OR circuit 20 receives the inputs of write data WDT and select signal ES and outputs an exclusive OR logical operation result. Inverter 21 outputs the inverted signal of the exclusive OR logical operation result as decoding signal DB.

Referring to FIG. 16, memory blocks MB0 to MB7 are selected in accordance with the same decoding results as those shown in FIG. 11 in relation to row addresses RA. Further, in FIG. 16, the settings of respective decoding circuits DB for supplying a data write current according to the level of write data WDT if each memory block is selected are shown.

By way of example, an operation for writing write data WDT at "H" level to memory cells corresponding to leading bit line BL<0> in memory block MB1 will be described.

In this case, as shown in FIG. 11, row decoder 410 sets both select signals ES<0> and ES<1> at "H" level according to row address RA. All the other select signals ES<2> to ES<8> are set at "L" level.

Next, if write data WDT (at "H" level) is inputted, each decoding circuit BF#a sets both decoding signals DB<0> and DB<1> at "H" level and sets decoding signals DB<2> to DB<8> at "L" level. Following this, in write current control circuit BLCa, inverter INV, which serves as a driver, electrically connects shared node NA to ground voltage GND.

Further, in write current control circuit BLCb1, inverter INVR, which serves as a driver, electrically connects shared node NB to power supply voltage VCC.

If so, no current is carried to shared bit line BL<0> in the region corresponding to memory block MB0 while data write current i1 is supplied shared bit BL<0> in the region corresponding to memory block MB1 in a direction from write current control circuit BLCL2 toward write current control circuit BLCL1. In memory block MB1, therefore, it is possible to write "H"-level write data to the memory cells corresponding to bit line BL<0>.

With this configuration, it is possible to share each write current control circuit between the adjacent memory blocks, to decrease the number of parts of each write current control circuit and to thereby further reduce the area of the entire column select related circuit.

Second Modification of Third Embodiment

Figure 17:
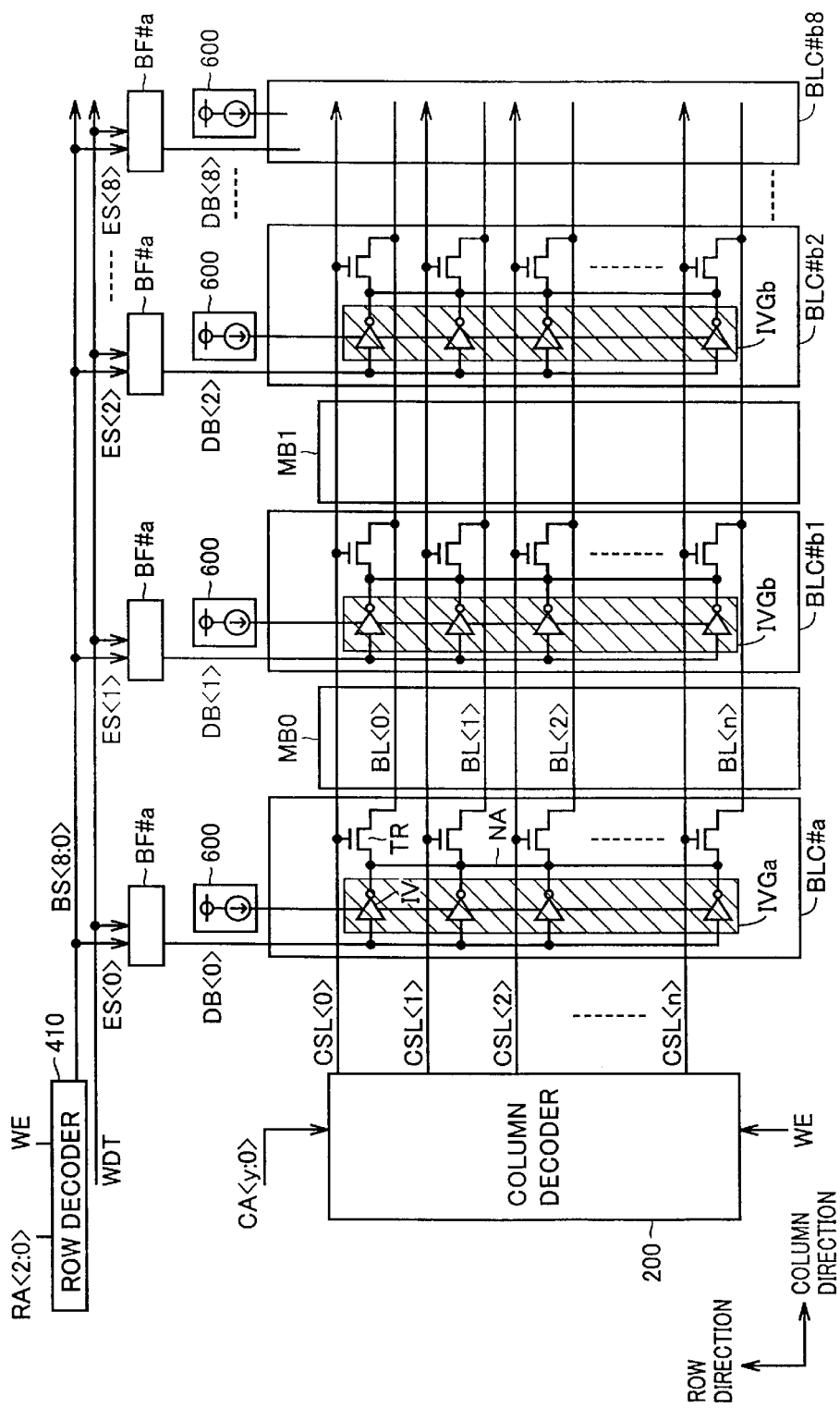
FIG. 17 is a circuit block diagram of a column select related circuit according to the second modification of the third embodiment of the present invention.

A column select related circuit according to the second modification of the third embodiment shown in FIG. 17 differs from that shown in FIG. 14 in that write current control circuit BLCa is replaced by write current control circuit BLC#a and write current control circuits BLCb1 to BLCb8 are replaced by write current control circuits BLC#b1 to BLC#b8, respectively. Since the other configuration is the same as that shown in FIG. 14, it will not be repeatedly described herein. It is noted that write current control circuit BLC#a shown in FIG. 17 includes precharge unit PU, though not shown.

With this configuration, similarly to the first modification of the third embodiment, it is possible to execute data write in accordance with the decoding tables shown in FIGS. 11 and 16.

Since each write current control circuit BLC is replaced by write current control circuit BLC#, (N+1) inverters IV arranged in respective write current control circuits BLC# can be made small in size and arranged efficiently. Therefore, it is possible to further reduce the area of the entire column select related circuit, compared with the first modification of the third embodiment.

Fourth Embodiment

In the fourth embodiment, the application of the present invention to a memory array having hierarchical bit lines will be described.

Figure 18:
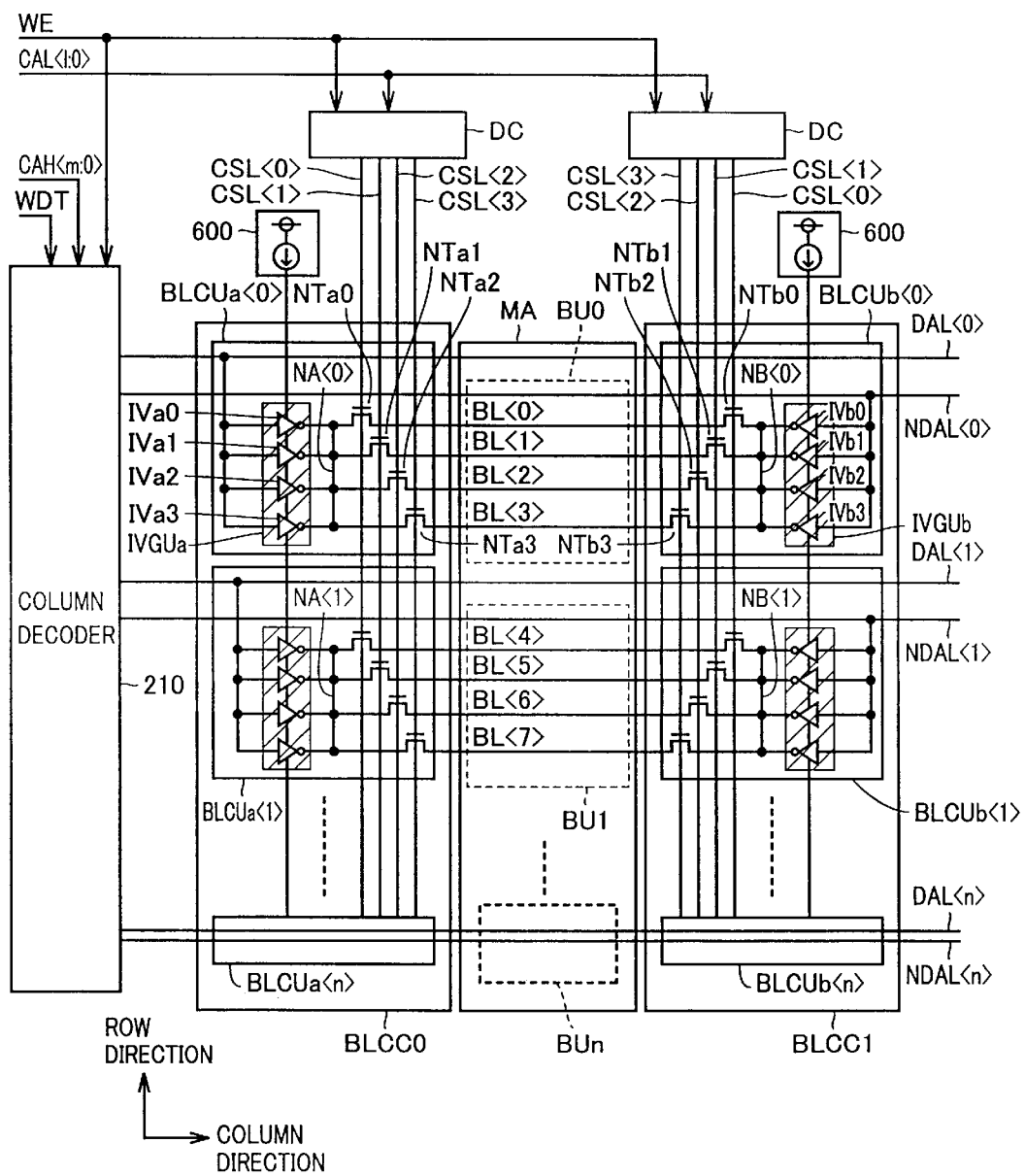
FIG. 18 a circuit block diagram of a column select related circuit according to the fourth embodiment of the present invention.

Referring to FIG. 18, memory array MA is divided into block units BU0 to BUn (to be also referred to generically as "block units BU" hereinafter) arranged in a row direction. Each block unit BU includes four memory cell columns and bit lines are provided to correspond to the respective memory cell columns.

The column select related circuit according to the fourth embodiment of the present invention includes data line pairs DAL<0>, NDAL<0> to DAL<n>, NDAL<n> (to be also referred to generically as "data line pairs DAL and NDAL" hereinafter) which are provided to correspond to the respective block units included in memory array MA, a column decoder 210 which selects data line pair DAL, NDAL in accordance with the inputs of higher bits CAH<m:0> (where m is a natural number) of column address CA and write data WDT and transmits complementary data signals to selected data line pair, decoding circuits DC which activate column select lines CSL<0> to CSL<3> arranged in a direction orthogonal to bit lines BL in accordance with lower bits CAL<1:0> (where 1 is a natural number) of column address CA inputted while write enable WE is activated, write current control circuits BLCC0 and BLCC1, and current sources 600.

Write current control circuit BLCC0 includes write control units BLCUa0 to BLCUan (to be also referred to generically as "write control units BLCUa" hereinafter) which are provided to correspond to respective block units BU0 to BUn. In addition, write current control circuit BLCC1 includes write control units BLCUb0 to BLCUbn (to be also referred to generically as "write control units BLCUb" hereinafter) which are provided to correspond to respective block units BU0 to BUn.

In write current control circuit BLCC0, four column select lines CSL<0> to CSL<3> for selecting one of the four bit lines connected to each write control unit BLCUa are provided in each write control unit BLCUa in common. Likewise, in write current control circuit BLCC1, four column select lines CSL<0> to CSL<3> for selecting one of the four bit lines connected to each write control unit BLCUb are provided in each write control unit BLCUb in common.

Decoding circuit DC arranged to correspond to write current control circuit BLCC0 selectively activates one of column select lines CSL<0> to CSL<3> in accordance with lower bits of column address CAL<1:0> (where 1 is a natural number) if write enable WE is active. Likewise, decoding circuit DC arranged to correspond to write current control circuit BLCC1 selectively activates one of column select lines CSL<0> to CSL<3>.

Write current control unit BLCUa0 will be typically described.

Write current control unit BLCUa0 includes inverter group IVGUa having inverters IVa0 to IVa3, and N-channel MOS transistors NTa0 to NTa3. Each of inverters IVa0 to IVa3 electrically connects one of power supply voltage VCC and ground voltage GND to a shared node NA<0> in accordance with a data signal transmitted to data line DAL<0>. N-channel MOS transistors NTa0 to NTa3 are provided to correspond to bit lines BL<0> to BL<3>, respectively and electrically connect shared node NA<0> to selected bit line BL in accordance with selectively activated column select lines CSL<0> to CSL<3>, respectively.

Write current control unit BLCUb0 operates similarly to write current control unit BLCUa0.

Write current control unit BLCUb0 includes inverter group IVGUb having inverters IVb0 to IVb3, and N-channel MOS transistors NTb0 to NTb3. Each of inverters IVb0 to IVb3 electrically connects one of power supply voltage VCC and ground voltage GND to a shared node NB<0> in accordance with a data signal transmitted to data line NDAL<0>. N-channel MOS transistors NTb0 to NTb3 are provided to correspond to bit lines BL<0> to BL<3>, respectively and electrically connect shared node NB<0> to selected bit line BL in accordance with selectively activated column select lines CSL<0> to CSL<3>, respectively.

Figure 19:
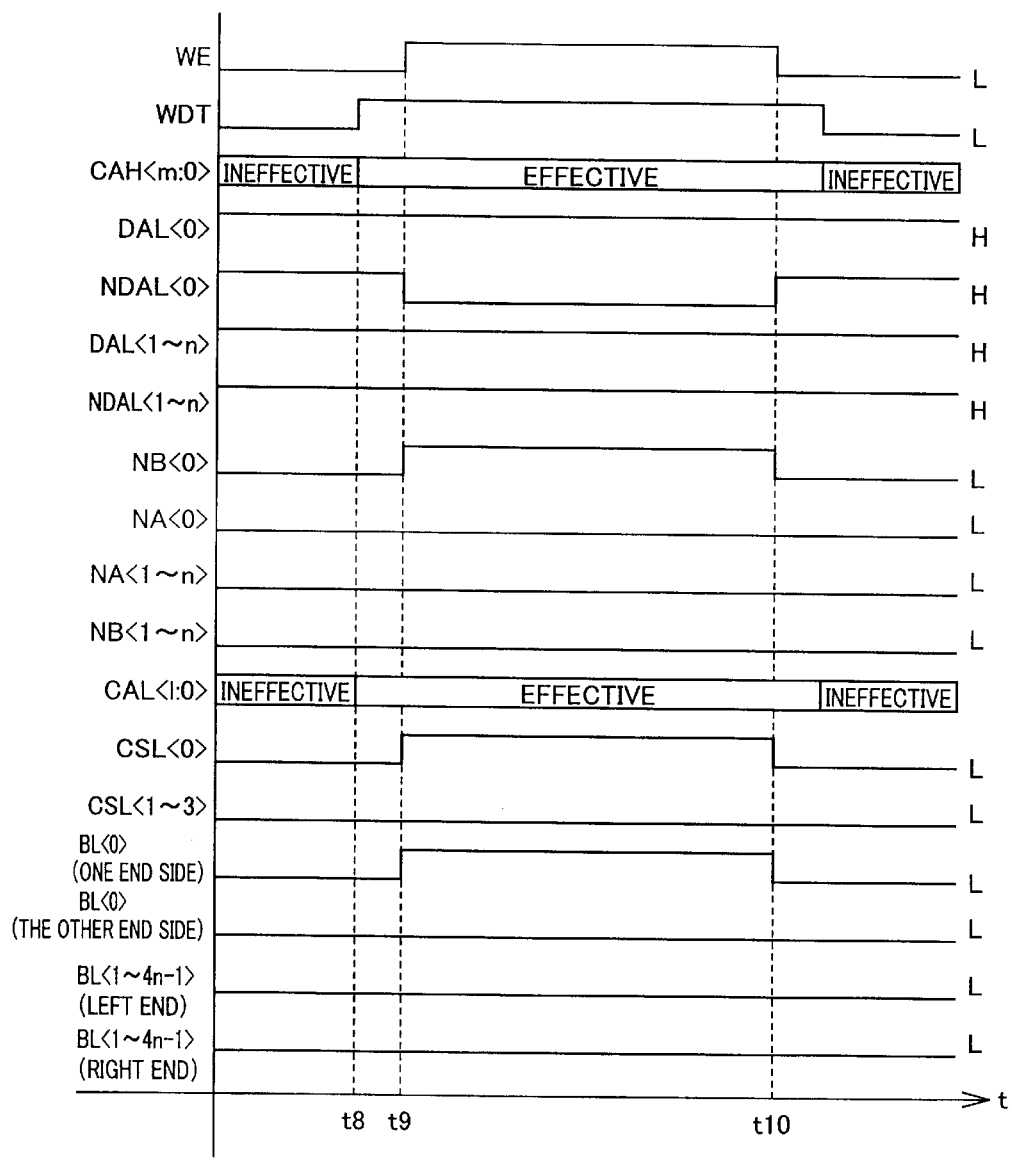
FIG. 19 is a timing chart in a case where a bit line is selected in a memory array.

Referring to FIG. 19, a data write operation if bit line BL<0> is selected in memory array MA will be described.

At time t8 before executing data write, write data WDT is set at "H" level. As a result, "H"-level write data is inputted into column decoder 210.

Next, at time t9 at which write enable WE is active, column decoder 210 selects one of data line pairs DAL<0>, NDAL<0> to DAL<n>, NDAL<n> in accordance with the input of a column address CAH. In this embodiment, data line pair DAL<0>, NDAL<0> are selected. Data line NDAL<0> transmits a data signal at "L" level. Therefore, data line DAL<0> which transmits a complementary data line transmits a data signal at "H" level. All other data line pairs DAL<1>, NDAL<1> to DAL<n>, NDAL<n> are unselected and corresponding data line pairs DAL, NDAL are set at "H" level. Accordingly, write control unit BLCUa0 in write current control circuit BLCC0 electrically connects node NA<0> to ground voltage GND in accordance with the "H"-level data signal. Write control unit BLCUb0 in write current control circuit BLCC1 electrically connects node NB<0> to power supply voltage VCC in accordance with the "L"-level data signal. As a result, shared node NA<0> is set at "L" level and shared node NB<0> is set at "H" level.

Further, each decoding circuit DC selects one of column select lines CSL<0> to CSL<3> based on the lower bits of column address CAL. In this embodiment, column select line CSL<0> is activated.

Following the selection of column select line CSL<0>, the other end side of selected bit line BL<0> is at "H" level and one end side thereof is at "L" level and data write current i1 corresponding to "H"-level write data is carried to selected bit line BL<0> in a direction from write current control circuit BLCC1 toward write current control circuit BLCC0.

Next, at time t10, the level of write enable WE becomes "L" level. Accordingly, data line pair DAL<0>, NDAL<0> are set at "H" level. Namely, nodes NA<0> and NB<0> are set at "L" level to prepare for the next cycle.

As can be seen, even if each data line pair DAL, NDAL are provided to correspond to four bit lines and the bit lines are hierarchized, it is possible to supply data write current i0 or i1 according to the level of write data WDT to the select target, selected bit line.

With this configuration, bit lines BL are hierarchized, thereby making it possible to decrease the number of column select lines CSL. It is, therefore, possible to decrease the number of parts of the column select related circuit. Since the column decoder is shared, it is possible to reduce the area of a chip as a whole.

It is shown the configuration of inverter group IVGUa, IVGUb each having a plurality of inverter in each of write control unit BLCUa, BLCUb. It is possible to change a configuration to provide one inverter instead of each of the inverter group IVGUa, IVGUb.

Fifth Embodiment

In the fifth embodiment, the application of the present invention to the configuration of a memory array which is divided into a plurality of memory blocks because of the mass storage capacity of the memory array.

Figure 20:
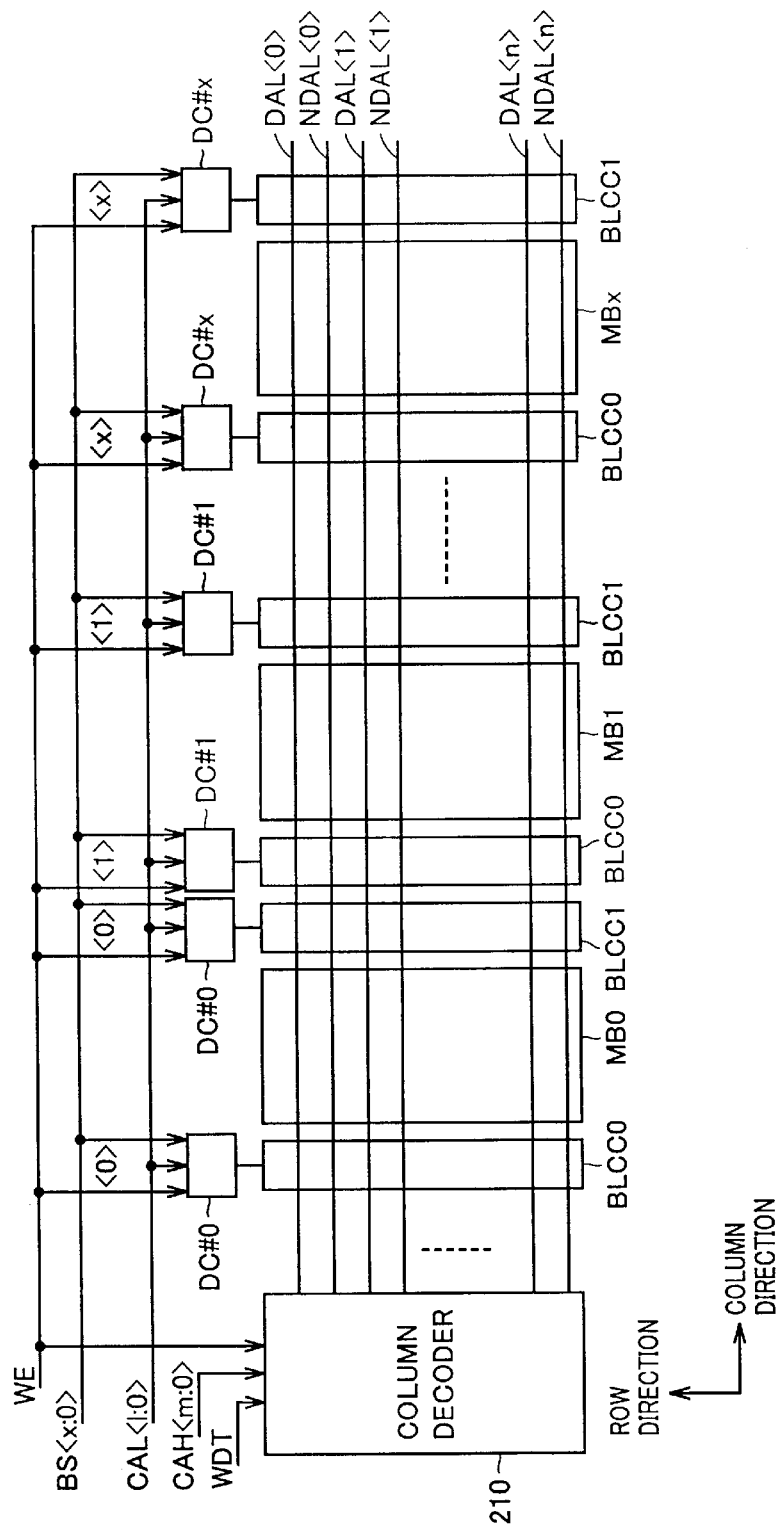
FIG. 20 is a circuit block diagram of a column select related circuit according to the fifth embodiment of the present invention.

Referring to FIG. 20, a column select related circuit according to the fifth embodiment of the present invention has an extended circuit configuration from that of the column select related circuit described in the forth embodiment. In FIG. 20, the configuration of the column select related circuit in which the memory array is divided into memory blocks MB1 to MBx is shown.

Write current control circuits BLCC0 and BLCC1 are arranged on the both sides of each memory block MB, respectively.

Decoding circuits DC# are provided to correspond to write current control circuits BLCC0 and BLCC1, respectively. Decoding circuits DC#0 are provided to correspond to write current control circuits BLCC0 and BLCC1 in memory block MB0, respectively. The other decoding circuits are provided similarly in memory blocks MB1 to MBx, respectively. It is noted that "decoding circuits DC#" generically express decoding circuits DC#0 to DC#x. Decoding circuit DC# differs from decoding circuit DC in that block select signal BS is further inputted. Each decoding circuit DC# selectively activates column select lines CSL<0> to CSL<3> in response to the inputs of lower bits of column address CAL and block select signal BS.

In addition, data line pairs DAL<0>, NDAL<0> to DAL<n>, NDAL<n> are arranged to be shared among memory blocks MB0 to MBx. Each write current control circuit BLCC0 is connected to data lines DAL<0> to DAL<n> arranged in common to the memory blocks. Each write current control circuit BLCC1 is connected to data lines NDAL<0> to NDAL<n> arranged in common to the memory blocks.

With this configuration, one of memory blocks MB0 to MBx is selected in accordance with the input of block select signal BS. Specifically, one of decoding circuits DC#0 to DC#x is selected. Since a data write operation for writing data to selected memory block MB is the same as that in the fourth embodiment described with reference to FIG. 19, it will not be repeatedly described herein.

With this configuration, by sharing data lines DAL and NDAL among the memory blocks, it is possible to decrease the number of data lines. It is also possible to share column decoder 210. It is, therefore, possible to reduce the circuit area of the column select related circuit for the mass storage memory array.

First Modification of Fifth Embodiment

The first modification of the fifth embodiment of the present invention is intended to reduce the circuit area of a column select related circuit by providing a configuration in which each write current control circuit can be shared between adjacent memory blocks.

Figure 21:
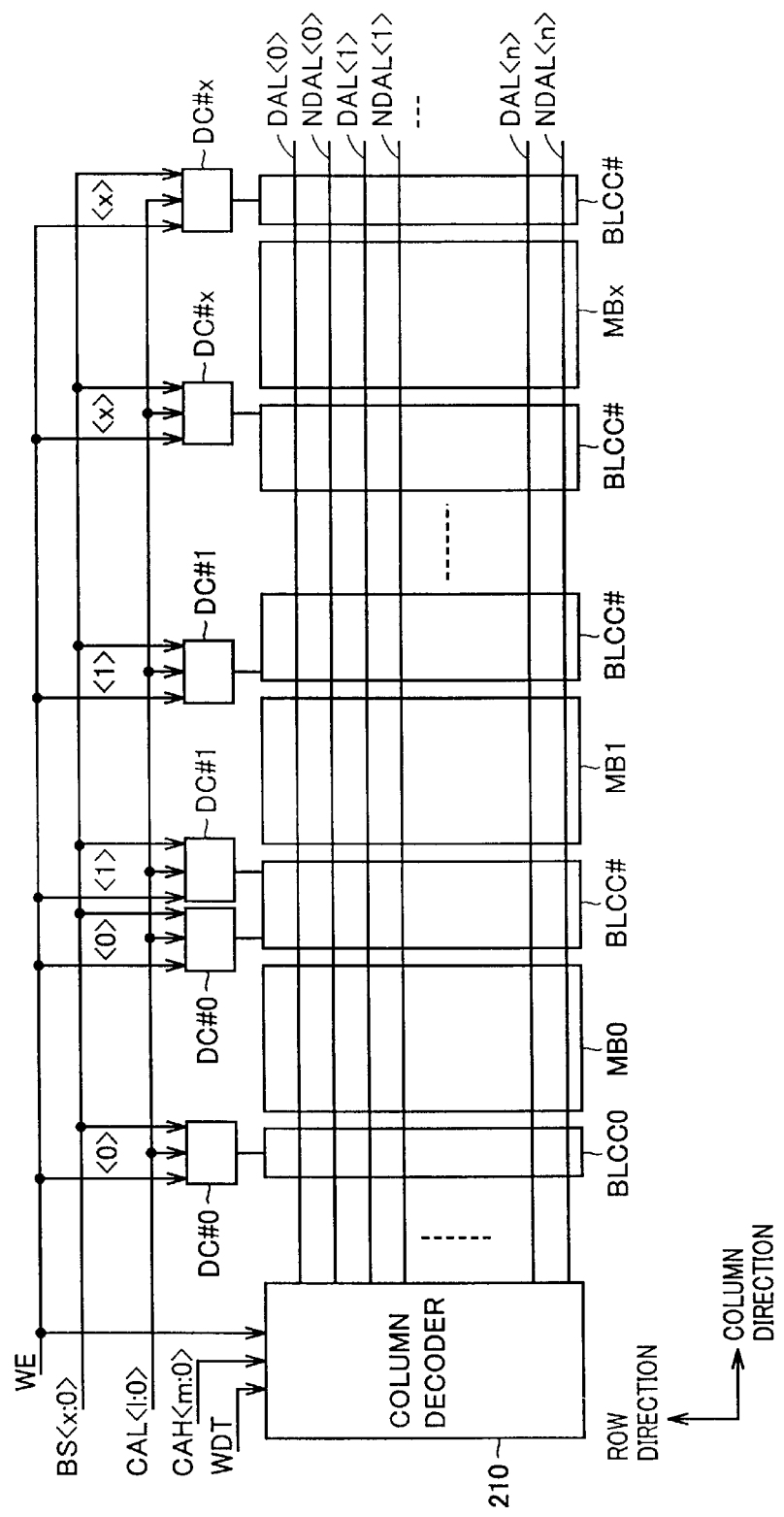
FIG. 21 is a conceptual view of a column select related circuit according to the first modification of the fifth embodiment of the present invention.

Referring to FIG. 21, a column select related circuit according to the first modification of the fifth embodiment differs from that shown in FIG. 20 in that each of write current control circuits BLCC0 and BLCC1 arranged between the two adjacent memory blocks MB is replaced by write current control circuit BLCC#. The other write current control circuits will be denoted generically as "write current control circuits BLCC#".

Figure 22:
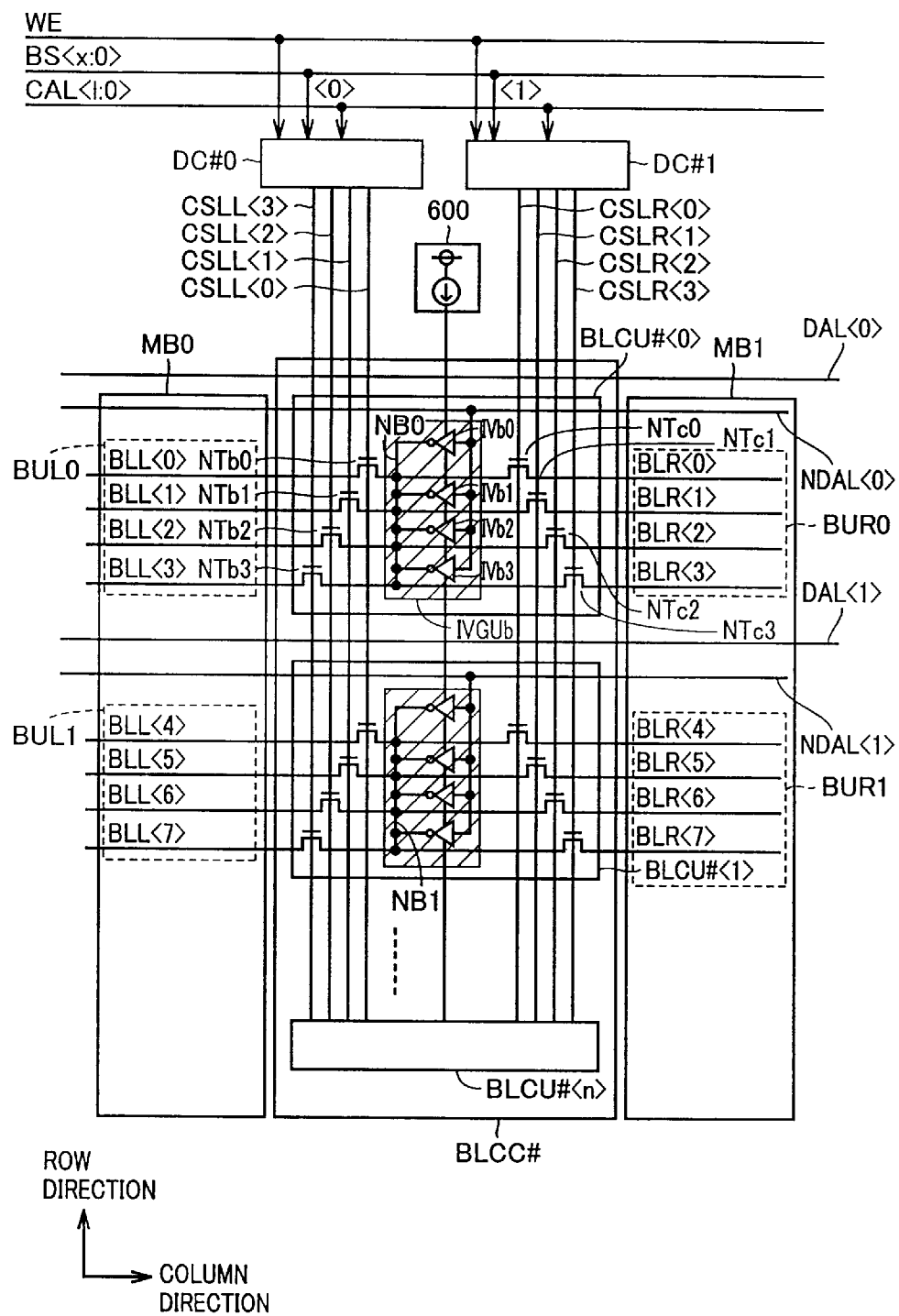
FIG. 22 is a circuit block diagram of a write current control circuit arranged between two adjacent memory blocks.

Referring to FIG. 22, write current control circuit BLCC# arranged between two adjacent typical memory blocks MB0 and MB1 includes write control units BLCU#0 to BLCU#n.

In addition, memory block MB0 includes block units BUL0 to BULn. FIG. 22 typically shows block units BUL0 and BUL1. Due to this, bit lines BLL<0> to BLL<3> which are provided to correspond to four memory cell columns, respectively included in block unit BUL0 and bit lines BLL<4> to BLL<7> which are provided to correspond to four memory cell columns, respectively included in block unit BUL1 are typically shown in FIG. 22.

Further, memory block MB1 includes block units BUR0 to BURn. FIG. 22 typically shows block units BUR0 and BUR1. Due to this, bit lines BLR<0> to BLR<3> which are provided to correspond to four memory cell columns, respectively included in block unit BUR0 and bit lines BLR<4> to BLR<7> which are provided to correspond to four memory cell columns, respectively included in block unit BUR1 are typically shown in FIG. 22.

FIG. 22 also shows decoding circuit DC#0 which is provided to correspond to memory block MB0 and decoding circuit DC#1 which is provided to correspond to memory block MB1. Decoding circuit DC#0 selectively activates column select lines CSLL<0> to CSLL<3> which control transistors arranged to correspond to memory block MB0-side bit lines BLL, respectively, in write control units BLCU# in write current control circuit BLCC#. Decoding circuit DC#1 selectively activates column select lines CSLR<0> to CSLR<3> which control transistors arranged to correspond to memory block MB1-side bit lines BLR, respectively, in write control units BLCU# in write current control circuit BLCC#, to thereby executes selecting one of column select lines CSLR<0> to CSLR<3>.

Further, write current control circuits BLCC# are alternately connected to different data lines DAL or NDAL. Namely, even-numbered write current control circuit BLCC# is connected to data line DAL and odd-numbered write current control circuit BLCC# is connected to data line NDAL. For example, write current control circuit BLCC# arranged between memory blocks MB0 and MB1 is connected to data line NDAL. Write current control circuit BLCC# arranged between memory blocks MB1 and MB2 is connected to data line DAL. Likewise, the other write current control circuits are alternately connected to data lines DAL or NDAL. In this embodiment, write current control unit BLCU#0 connected to data line NDAL<0> will be typically described.

Write current control unit BLCU#0 includes N-channel MOS transistors NTb0 to NTb3, N-channel MOS transistors NTc0 to NTc3 and inverter group IVGUb having inverters IVb0 to IVb3.

Write current control unit BLCU#0 is constituted so that the inverters, each of which serves as a driver for electrically connecting each bit line to one of power supply voltage VCC and ground voltage GND, are shared between two adjacent write current control circuits BLCC0 and BLCC1 shown in FIG. 20.

Specifically, each of inverters IVb0 to IVb3 electrically connects shared node NB to one of power supply voltage VCC and ground voltage GND in accordance with a decoding signal NDB<0> from data line NDAL<0>.

N-channel MOS transistors NTb0 to NTb3 are arranged between shared node NB0 and block unit BUL0 to correspond to bit lines BLL<0> to BLL<3> of block unit BUL0 and turned on according to the selection results of column select lines CSLL<0> to CSLL<3>, respectively. In addition, N-channel MOS transistors NTc0 to NTc3 are arranged between shared node NB0 and block unit BUR0 to correspond to bit lines BLR<0> to BLR<3> of block unit BUR0 and turned on according to the selection results of column select lines CSLR<0> to CSLR<3>, respectively.

With this configuration, if memory block MB0 is selected, for example, decoding circuit DC#0 is activated in accordance with block select signal BS0. Therefore, write current control circuit BLCC# selectively, electrically connects bit lines BLL of memory block MB0 among adjacent memory blocks MB0 and MB1 according to selectively activated column select lines CSLL to shared node NB.

On the other hand, since decoding circuit DC#1 is deactivated, column select lines CSLR are unselected and do not electrically connect bit lines BLR of adjacent memory block MB1 to shared node NB. A data write operation for writing data to the selected memory block is the same as that in the fifth embodiment.

This configuration, therefore, makes it possible to employ the inverters which correspond to drivers, to be shared among the bit lines arranged to adjacent memory blocks MB in write current control unit BLCU#.

That is, by constituting each write current control circuit to be able to be shared between the adjacent memory blocks, it is possible to further reduce the circuit area of the column select related circuit, compared with the fifth embodiment.

It is shown the configuration of inverter group IVGUb having a plurality of inverter in write control unit BLCU#. It is possible to change a configuration to provide one inverter instead of inverter group IVGUb.

Sixth Embodiment

In the sixth embodiment of the present invention, the application of the present invention to a plurality of memory blocks each having other hierarchical bit lines will be described.

Figure 23:
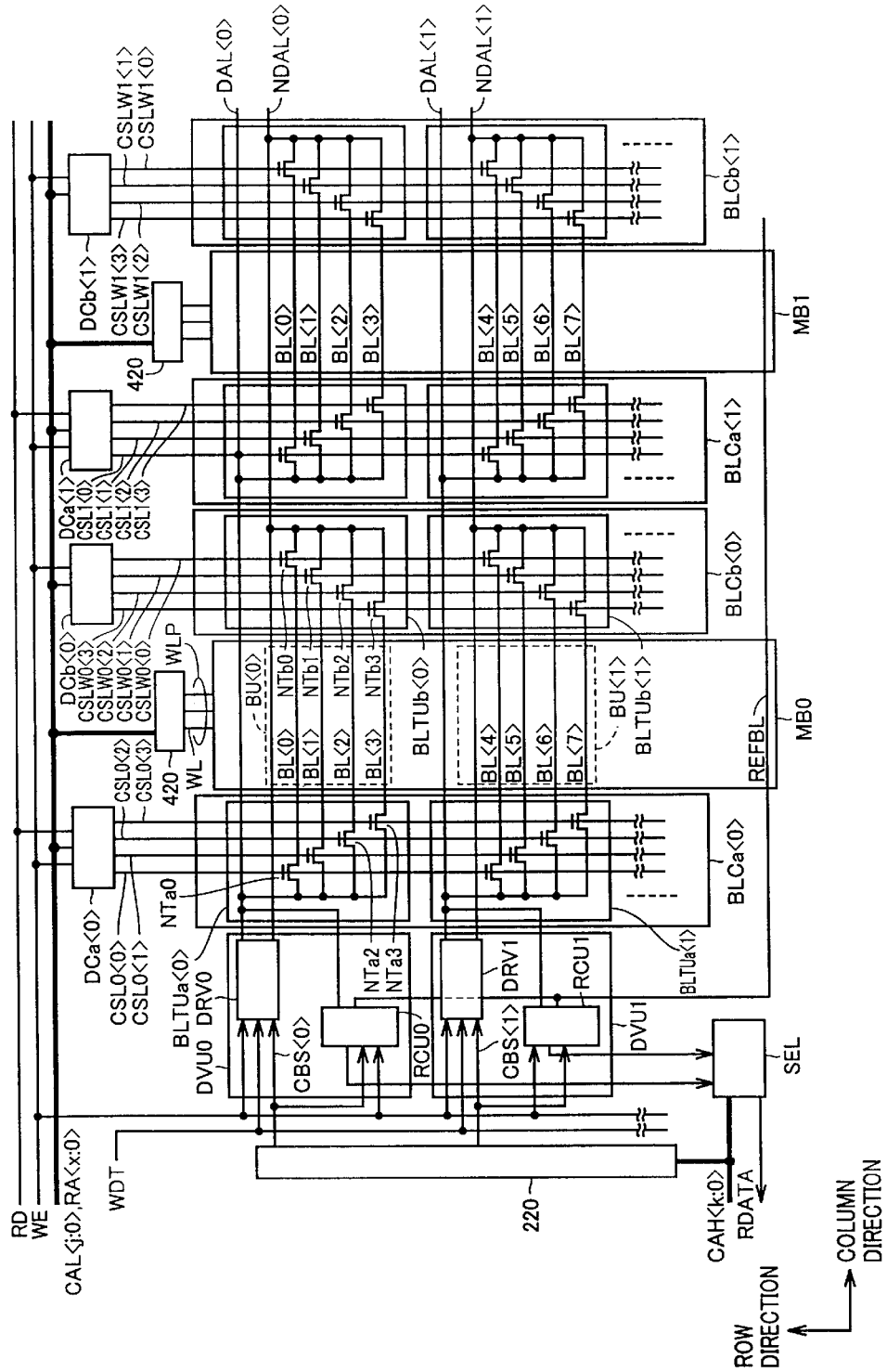
FIG. 23 is a circuit block diagram of a column select related circuit according to the sixth embodiment of the present invention.

Referring to FIG. 23, a column select related circuit according to the sixth embodiment of the present invention includes a plurality of memory blocks MB arranged in a column direction. FIG. 23 typically shows memory blocks MB0 and MB1.

Each memory block MB includes a plurality of block units BU in a row direction. By way of example, each block unit BU includes four memory cell columns and bit lines are provided to correspond to the respective memory cell columns.

In memory block MB0, block units BU<0> and BU<1> are typically shown. In block unit BU<0>, bit lines BL<0> to BL<3> are provided to correspond to the four memory cell columns, respectively. Likewise, in block unit BU<1>, bit lines BL<4> to BL<7> are provided to correspond to the four memory cell columns, respectively.

Further, in the column select related circuit according to the sixth embodiment of the present invention, data line pairs, each consisting of two data lines DAL and NDAL, are provided to be shared among block units BU which constitute the same columns in respective memory blocks MB.

FIG. 23 typically shows data line pair DAL<0>, NDAL<0> shared among the block units which constitute the same column as block unit BU<0>, and data line pair DAL<1>, NDAL<1> shared among the block units which constitute the same column as block unit BU<1>. It is noted that data lines DAL generically express data lines DAL<0>, DAL <1>, . . . and that data lines NDAL generically express data lines NDAL<0>, DAL <1>, . . . .

Further, block control circuit BLCa which controls the connection between each data line DAL and each block unit BU and block control circuit BLCb which controls the connection between each data line NDAL and each block unit BU are arranged for each memory block MB.

FIG. 23 shows that block control circuit BLCa<0> which controls the connection between each data line DAL and each block unit BU and block control circuit BLCb<0> which controls the connection between each data line NDAL and each block unit BU are arranged to correspond to memory block MB0.

In addition, the column select related circuit according to the sixth embodiment of the present invention includes driver units DVU corresponding to respective data line pairs DAL, NDAL. FIG. 23 typically shows driver units DVU0 which is provided to correspond to data line pair DAL<0>, NDAL<0>. In addition, FIG. 23 typically shows driver units DVU1 which is provided to correspond to data line pair DAL<1>, NDAL<1>. Since other driver units DVU are the same in configuration to driver units DVU1 and DVU2, they will not be repeatedly described herein.

The column select related circuit according to the sixth embodiment of the present invention includes a column decoder 220 which generates column block select signals CBS which selectively activate driver units DVU in accordance with higher bits of column addresses CAH<k:0>, respectively.

Further, block control circuit BLCa includes block control unit BLTUa each of which controls the connection between each data line DAL and each block unit BU. Since block control units BLTUa are the same in configuration, block control unit BLTUa<0> provided to correspond to block unit BU<0> will be typically described herein.

Block control unit BLTUa<0> includes transistors NTa0 to NTa3 which control the connection between one end sides of bit lines BL<0> to BL<3> and data line DAL<0>, respectively. The gates of transistors NTa0 to NTa3 are connected to column select lines CSL0<0> to CSL0<3>, respectively.

Likewise, block control circuit BLCb includes block control unit BLTUb each of which controls the connection between each data line NDAL and each block unit BU. Since block control units BLTUb are the same in configuration, block control unit BLTUb<0> provided to correspond to block unit BU<0> will be typically described herein.

Block control unit BLTUb<0> includes transistors NTb0 to NTb3 which control the connection between the other end sides of bit lines BL<0> to BL<3> and data line NDAL<0>, respectively. The gates of transistors NTb0 to NTb3 are connected to column select lines CSLW0<0> to CSLW0<3>, respectively. Since the other configuration is the same, it will not be repeatedly described herein.

The column select related circuit according to the sixth embodiment of the present invention further includes decoders DCa and DCb provided to correspond to block control circuits BLCa and BLCb, respectively. FIG. 23 typically shows decoder DCa<0> provided to correspond to block control circuit BLCa<0> and decoder DCb<0> provided to correspond to block control circuit BLCb<0>.

Decoder DCa<0> selectively activates column select lines CSL0<0> to CSL0<3> in accordance with the inputs of lower bits of column addresses CAL<j:0>, row addresses RA<x:0>, write enable WE and a read signal RD.

In addition, decoder DCb<0> selectively activates column select lines CSLW0<0> to CSLW0<3> in accordance with the inputs of lower bits of column addresses CAL<j:0>, row addresses RA<x:0>, write enable WE and read signal RD. Since other decoders DCa and DCb are the same in configuration as decoders DCa<0> and DCb<0>, they will not be repeatedly described herein.

Further, the column select related circuit according to the sixth embodiment of the present invention includes a selector SEL which selectively changes over read data from respective driver units DVU and outputs read data RDATA in accordance with the inputs of higher bits of column addresses CAH<k:0>.

The configuration of driver unit DVU will be described. Here, the configuration of driver unit DVU<0> will be typically described. Driver unit DVU0 includes a driver DRV0 which drives data lines DAL<0>, NADL<0>, and a read unit RCU0 which is connected to data line DAL<0> and a reference bit line REFBL supplying a reference current and which outputs read data according to the difference in pass current between signal lines to selector SEL during data read.

Driver unit DRV0 electrically connects data lines DAL<0>, NDAL<0> to one of power supply voltage VCC and ground voltage GND and the other voltage VCC or GND, respectively, in accordance with the inputs of column block select signal CBS<0> from column decoder 220, write data WDT and write enable WE. Read unit RCU0 is activated in accordance with write enable WE and column block select signal CBS<0>, to output the read data according to the difference in pass current between data line DAL<0> and reference bit line REFBL to selector SEL. Since other driver units DVU are the same in configuration as driver unit DVU0, they will not be repeatedly described herein.

In each memory block MB, a plurality of word lines WL are arranged to correspond to memory cell rows, respectively. A row decoder 420 is provided to correspond to each memory block MB. Row decoder 420 selectively activates one word line WL in a word line group WLP which is a collection of word lines WL in accordance with the inputs of row addresses RA<x:0>.

Figure 24:
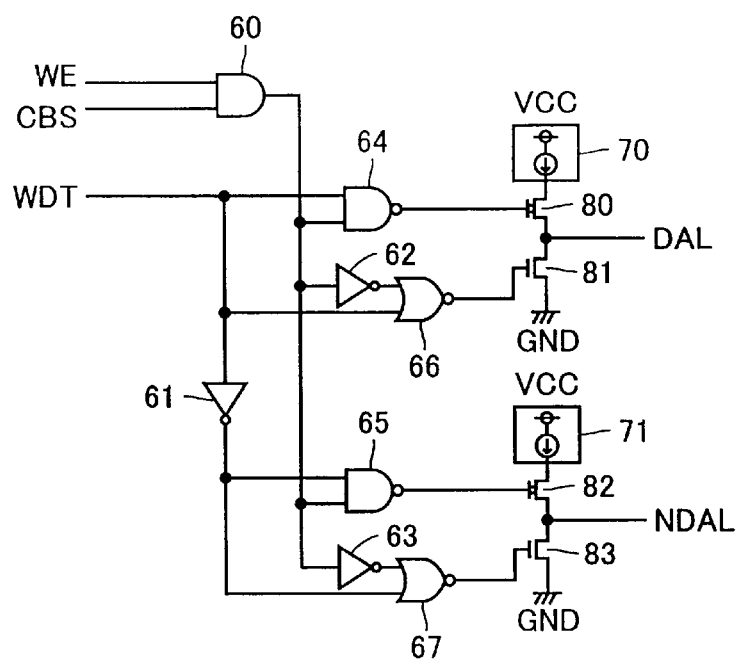
FIG. 24 is a circuit block diagram of a driver included in a driver unit.

Referring to FIG. 24, driver DRV included in each driver unit DVU according to the sixth embodiment of the present invention includes an AND circuit 60, inverters 61 to 63, NAND circuits 64 and 65, NOR circuits 66 and 67, constant-current supply circuits 70 and 71 and transistors 80 to 83.

AND circuit 60 outputs an AND logical operation result for write enable WE and column block select signal CBS to NAND circuits 64 and 65 and inverters 62 and 63 in accordance with the inputs of write enable WE and column block select signal CBS. NAND circuit 64 outputs a NAND logical operation result for write data WDT and the output signal of AND circuit 60 to transistor 80 in accordance with the inputs of write data WDT and AND circuit 60. NOR circuit 66 outputs a NOR logical operation result for the inverted signal of the output signal of AND circuit 60 through inverter 62 and write data WDT to the gate of transistor 81.

NAND circuit 65 outputs a NAND logical operation result to transistor 82 in accordance with an input of AND circuit 60 and an input of an inverted signal of write data WDT through inverter 61. NAND circuit 67 outputs NOR logical operation results to a gate of transistor 83 in accordance with an inputs of an inverted signal AND circuit 60 through inverter 63 and an input of an inverted signal write data WDT through inverter 61.

Transistors 80 and 81 are connected in series between a constant-current source 70 and ground voltage GND and the connection node which connects transistors 80 and 81 is electrically connected to data line DAL. Transistors 82 and 83 are connected in series between a constant-current source 71 and ground voltage GND and the connection node which connects transistors 82 and 83 is electrically connected to data line NDAL. It is assumed herein that transistors 80 and 82 are P-channel MOS transistors. It is also assumed herein that transistors 81 and 83 are N-channel MOS transistors.

Driver DRV according to the sixth embodiment of the present invention is activated in accordance with the inputs of write enable WE and column block select signal CBS to electrically connect data lines DAL and NDAL to one of constant-current source 70 and ground voltage GND and to the other 70 or GND, respectively, in response to the signal of write data WDT. For example, it is assumed that write enable WE and column block select signal CBS are both at "H" level and write data WDT is at "H" level. If so, transistor 80 is turned on and data DAL is electrically connected to constant-current source 70. Transistor 83 is turned on in response to the output signal of NOR circuit 67 and data line NDAL is electrically connected to ground voltage GND. Alternatively, it is assumed that write data WDT is at "L" level. If so, transistor 81 is turned on in response to the output signal of NOR circuit 66 and data line DAL is electrically connected to ground voltage GND. Transistor 82 is turned on in response to the output signal of NAND circuit 65 and data line NDAL is electrically connected to constant-current source 71.

Figure 25:
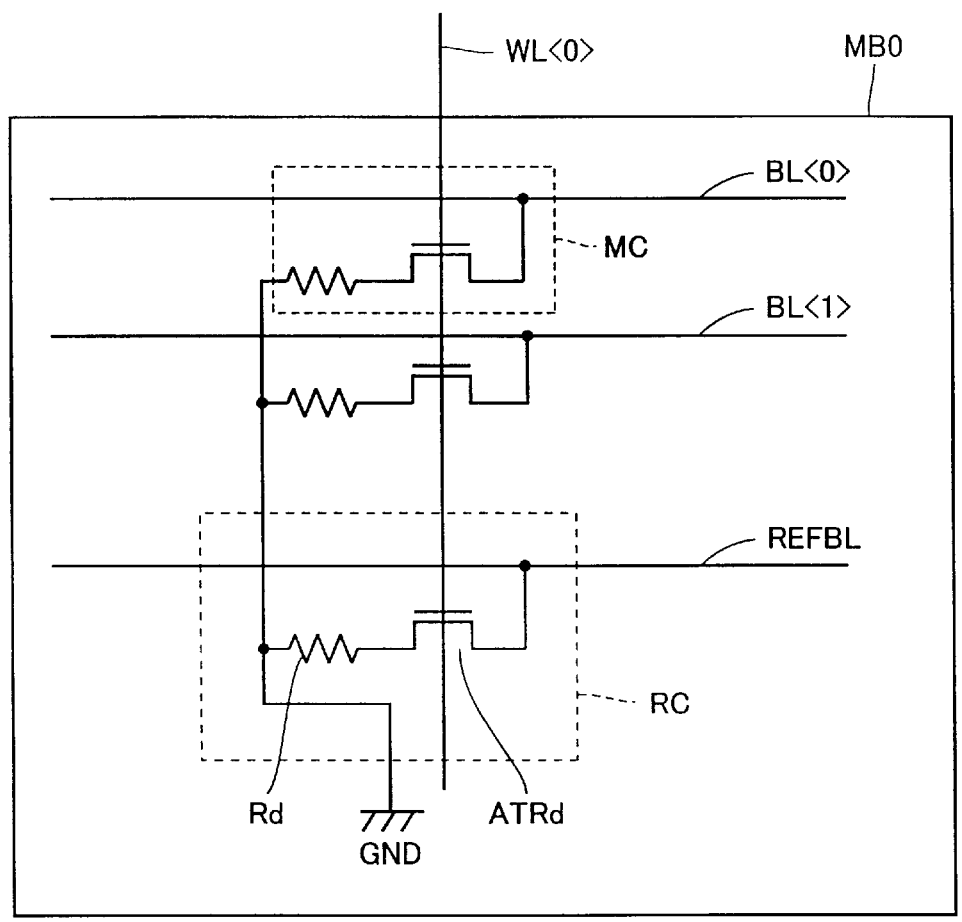
FIG. 25 is a block diagram showing a part of regions of memory blocks having reference bit lines.

Referring to FIG. 25, in a partial region of memory block MB0 including reference bit line REFBL, a reference resistance section RC which is arranged to share memory cells MC and a memory cell row are provided in addition to memory cell MC provided to correspond to word line WL<0> and bit line BL<0>. Likewise, reference resistance sections RC are arranged to correspond to reference bit line REFBL and respective word lines WL for the other memory cell rows. Each reference resistance section RC includes an access transistor ATRd and a resistance element Rd. Access transistor ATRd and resistance element Rd are connected in series between reference bit line REFBL and ground voltage GND.

Figure 33:
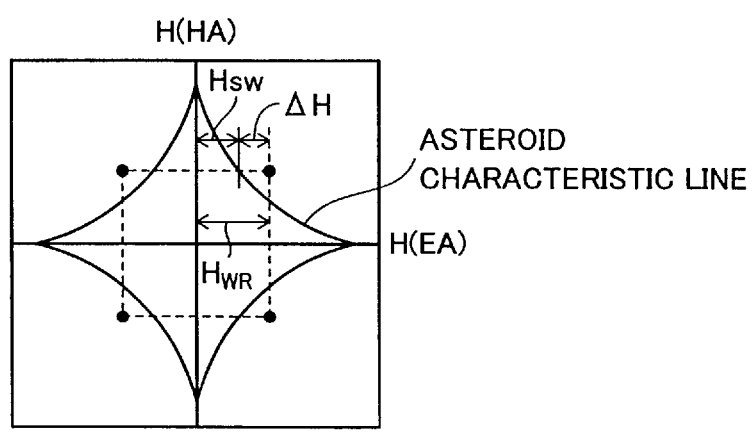
FIG. 33 is a conceptual view for describing the relationship between a data write current and the magnetization direction of a tunnel magneto-resistive element during data write.

For example, a case where memory cell MC corresponding to bit line BL<0> and word line WL<0> is selected will be considered. If word line WL<0> is selected in accordance with row address RA, reference resistance section RC corresponding to reference bit line REFBL which constitutes the same memory cell row is accessed. Access transistor ATRd of reference resistance section RC is turned on. In response to this, a current path is formed between read unit RDU and resistance element Rd and a reference current is supplied through reference bit line REFBL. It is noted that the resistance value of resistance element Rd is set in advance to supply the reference current to the reference bit line if the current path is formed. Specifically, the resistance value of resistance element Rd is set at the intermediate value between maximum value Rmax and minimum value Rmin of tunnel magneto-resistive element TMR described with reference to FIG. 33. Accordingly, the current becomes the intermediate current between a data read current corresponding to stored data "1" of memory cell MC and a data read current corresponding to stored data "0" of memory cell MC.

Figure 26:
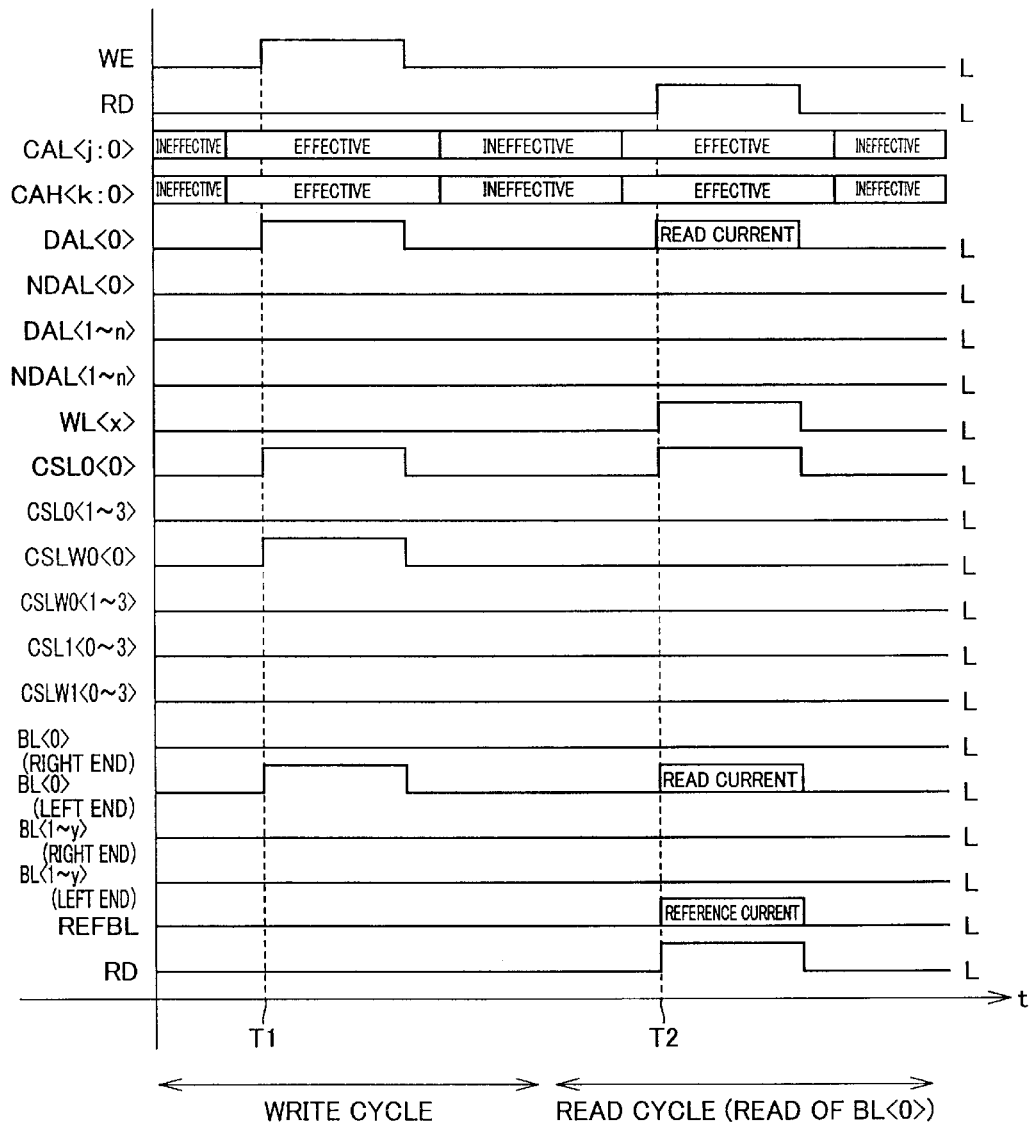
FIG. 26 is a timing chart showing the operation of a column select related circuit according to the sixth embodiment of the present invention.

Referring to the timing chart of FIG. 26, the operation of the column select related circuit according to the sixth embodiment of the present invention will be described.

By way of example, a case of executing a data write operation for writing data to bit line BL<0> of memory block MB0 will be described.

During data write, column address CA is inputted into row decoder 220. Row decoder 220 selectively activates one of column block select signals CBS in response to higher bits of column address CAH at time T1. In this case, column block select signal CBS<0> is set at "H" level. In addition, because of the data write operation, write enable WE is set at "H" level and one driver unit DVU is activated. In this case, driver unit DVU0 is activated in response to column block select signal CBS<0> and write enable WE. Driver unit DVU0 electrically connects one of data lines DAL<0> and NDAL<0> to the current source in accordance with write data WDT. Write data WDT is, for example, set at "H" level. If so, driver unit DVU0 electrically connects data line DAL<0> to constant-current source 70 and data line DAL<0> to ground voltage GND.

On the other hand, in accordance with row addresses RA<x:0>, decoders DCa and DCb corresponding to selected memory block MB are selected. In this case, decoder DCa<0> and DCb<0> corresponding to memory block MB0 are selected in accordance with row address RA. Following this selection, decoder DCa<0> selectively activates one of column select lines CSL in response to lower bits of column addresses CAL<j:0>. In this case, decoder DCa<0> activates column select line CSL<0> among column select lines CSL<0> to CSL<3>. In response to the activation of column select line CSL<0>, in block control unit BLTUa<0>, transistor NTa0 is turned on to thereby electrically connect data line DAL<0> to one end side of bit line BL<0>.

Further, decoder DCb<0> selectively activates one of column select lines CSLW in response to lower bits of column addresses CAL<j:0>. In this case, decoder DCb<0> activates column select line CSLW<0> among column select lines CSLW<0> to CSLW<3>. In response to the activation of column select line CSLW<0>, in block control unit BLTUb<0>, transistor NTb0 is turned on to thereby electrically connect data line NDAL<0> to the other end side of bit line BL<0>.

As a result, a data write current is supplied on the path of data line DAL<0>, transistor NTa0, transistor NTb0 and data line NDAL<0>, thereby executing data write.

Next, a case of executing a data read operation for reading data from memory cells corresponding to bit line BL<0> of memory block MB0 will be described.

During data read, column address CA is inputted into row decoder 220. Row decoder 220 selectively activates one of column block select signals CBS in response to higher bits of column address CAH at time T2. In this case, column block select signal CBS<0> is set at "H" level. In addition, because of the data read operation, read signal RD is set at "H" level and one read unit RCU is activated. On the other hand, since write enable WE is set at "L" level during data read, driver units DVU are deactivated. In this case, read unit RCU0 is activated in response to column block select signal CBS<0> and read signal RD and read unit RCU0 outputs read data in accordance with the difference in pass current between a data read current and a reference current.

On the other hand, in accordance with row addresses RA<x:0>, one decoder DCa corresponding to selected memory block MB is selected. In this case, decoder DCa<0> corresponding to memory block MB0 is selected in accordance with row address RA. Following this selection, decoder DCa<0> selectively activates one of column select lines CSL in response to lower bits of column addresses CAL<j:0>. In this case, decoder DCa<0> activates column select line CSL<0> among column select lines CSL<0> to CSL<3>. In response to the activation of column select line CSL<0>, in block control unit BLTUa<0>, transistor NTa0 is turned on. Accordingly, data line DAL<0> is electrically connected to one end side of bit line BL<0>. On the other hand, since decoder DCb<0> does not receive the input of read signal RD, decoder DCb<0> is deactivated and does not execute a column select operation. Accordingly, all of column select lines CSLW<0> to CSLW<3> to be activated by the column selection of decoder DCb<0> are inactive.

At time T2, row decoder 420 selects one word line WL in word line group WLP in response to the inputs of row addresses RA<x:0>. It is assumed herein that word line WL<0> is activated. If so, memory cell MC corresponding to bit line BL<0> and word line WL<0> is selected. As a result, a current path is formed between memory cell MC and read unit RCU0 through data line DAL<0> and a data read current is thereby supplied from read unit RCU0.

Further, if word line WL<0> is selected in response to row addresses RA as described above, reference resistance section RMC corresponding to reference bit line REFBL which constitutes the same memory cell row is also accessed and a reference current is supplied through reference bit line REFBL.

Accordingly, read unit RCU0 outputs read data RDATA to selector SEL in accordance with the current difference between the data read current carried to selected memory cell MC through data line DAL<0> and the reference current carried through reference bit line REFBL. As a result, the data stored in the selected memory is read.

Selector SEL outputs read data RDATA received from read unit RCU0 to the outside to reflect the selection result according to the higher bits of column address CAH.

With the configuration of the column select related circuit according to the sixth embodiment of the present invention, by employing the data line common to the respective bit lines, it is unnecessary to provide a driver for supplying a data write current to correspond to each bit line and it is, therefore, possible to reduce the area of the driver circuit zone. In addition, during data read, it is possible to supply the data read current using the data line common to the respective bit lines which constitute the same block unit. It is, therefore, possible to decrease the number of signal lines, to decrease the number of the parts of the circuit and to reduce the area of the bit line circuit zone.

First Modification of Sixth Embodiment

Figure 27:
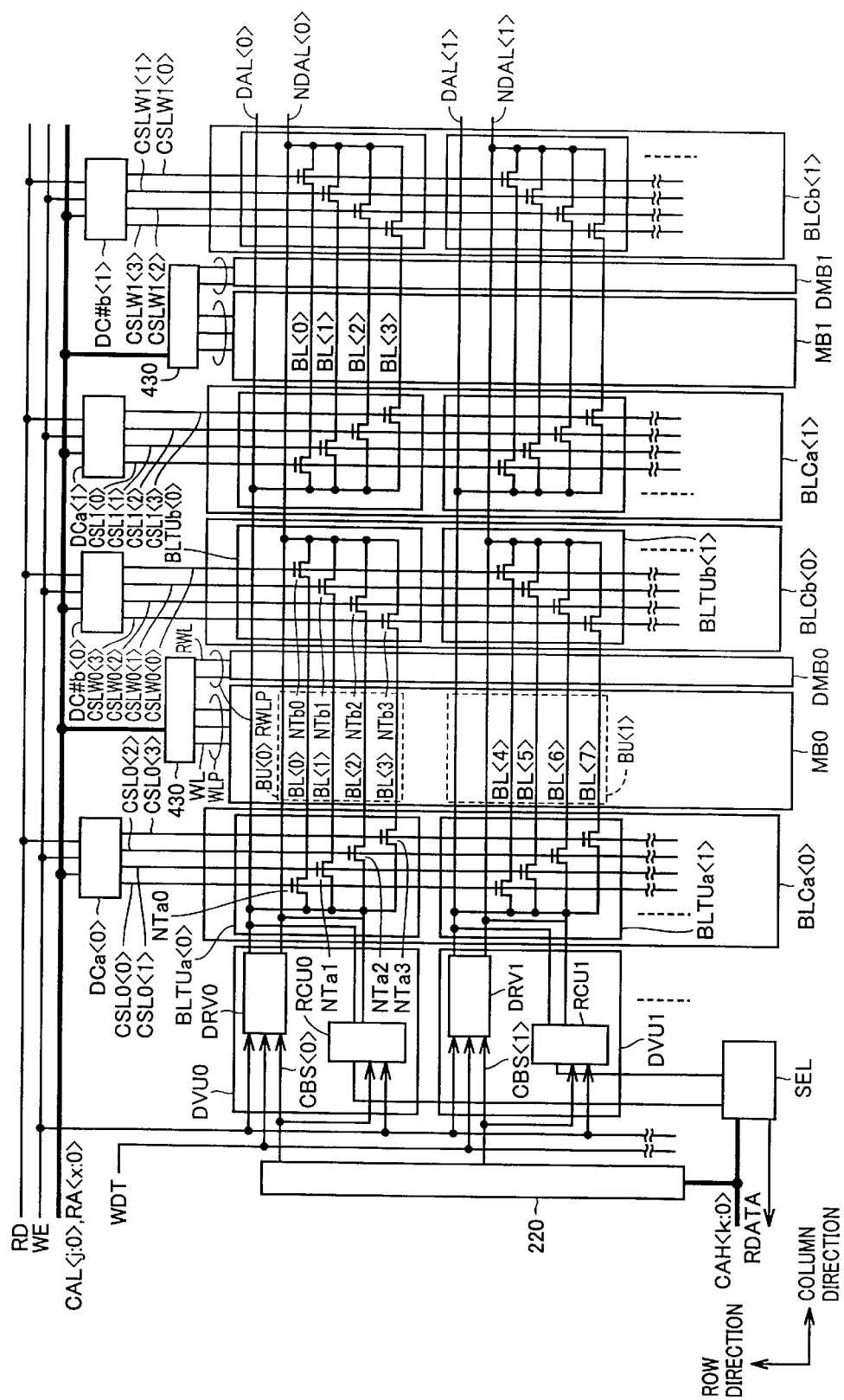
FIG. 27 is a circuit block diagram of a column select related circuit according to the first modification of the sixth embodiment of the present invention.

Referring to FIG. 27, a column select related circuit according to the first modification of the sixth embodiment of the present invention differs from that shown in FIG. 23 in that a memory block DMB is arranged for each memory block MB, reference bit line REFBL is eliminated, read units RCU are connected to data lines DAL and NDAL, decoders DCb are replaced by decoders DC#b and row decoder 420 is replaced by a row decoder 430. Since the other constituent elements are the same in configuration to those of the column select related circuit shown in FIG. 23, they will not be repeatedly described herein. FIG. 27 typically shows memory block DMB0 provided to correspond to memory block MB0. In addition, FIG. 27 typically shows decoders DC#b<0> and DC#b<1> which replace decoders DCb<0> and DCb<1>, respectively.

Memory block DMB includes reference memory cells arranged in a matrix. Memory block DMB also includes word lines RWL corresponding to memory cell rows, respectively. During data read, row decoder 420 selects one word line WL in word line group WLP in accordance with row address RA and one word line RWL in a word line group RWL in accordance with column address CA and selectively activates them.

Figure 28:
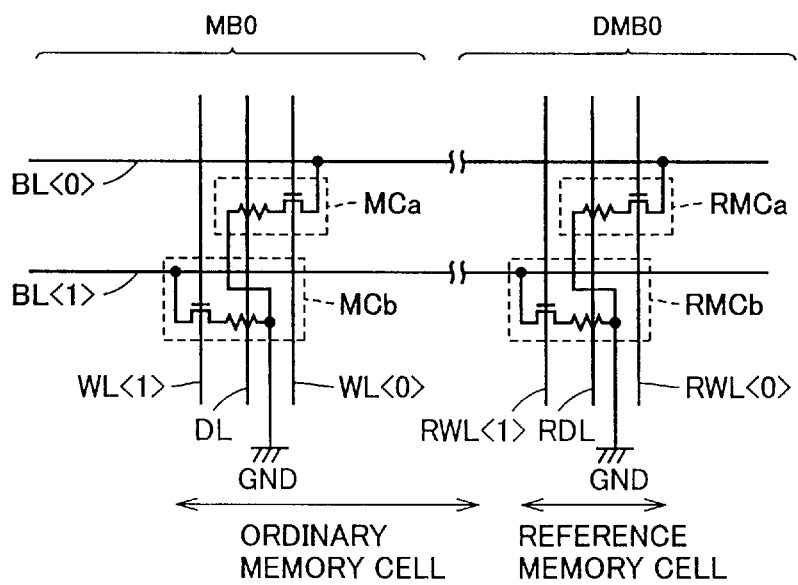
FIG. 28 shows the partial regions of two memory blocks.

Referring to FIG. 28, memory block MB0 includes bit lines BL<0> and BL<1> and word lines WL<0> and WL<1>. Bit lines BL<0> and BL<1> are arranged to correspond to one memory cell row. In addition, word lines WL<0> and WL<1> are arranged to correspond to respective memory cell columns. In memory block DMB0, reference memory cells RMC are arranged to share the memory cell columns of memory block MB0, respectively.

FIG. 28 typically shows reference memory cell RMCa provided to correspond to bit line BL<0> and reference memory cell RMCb provided to correspond to bit line BL<1>. Reference memory cell RMCa arranged on bit line BL<0> in an even-numbered column or the like is electrically connected to word line RWL<0>. Reference memory cell RMCb arranged on bit line BL<1> in an odd-numbered column or the like is electrically connected to word line RWL<1>. That is, reference memory cell RMC corresponding to bit line BL in the even-numbered column is electrically connected to word line RWL<0> and reference memory cell RMC corresponding to bit line BL in the odd-numbered column is electrically connected to word line RWL<1>. Since other reference memory cells RMC are the same in configuration as reference memory cells RMCa and RMCb, they will not be repeatedly described herein.

Figure 29:
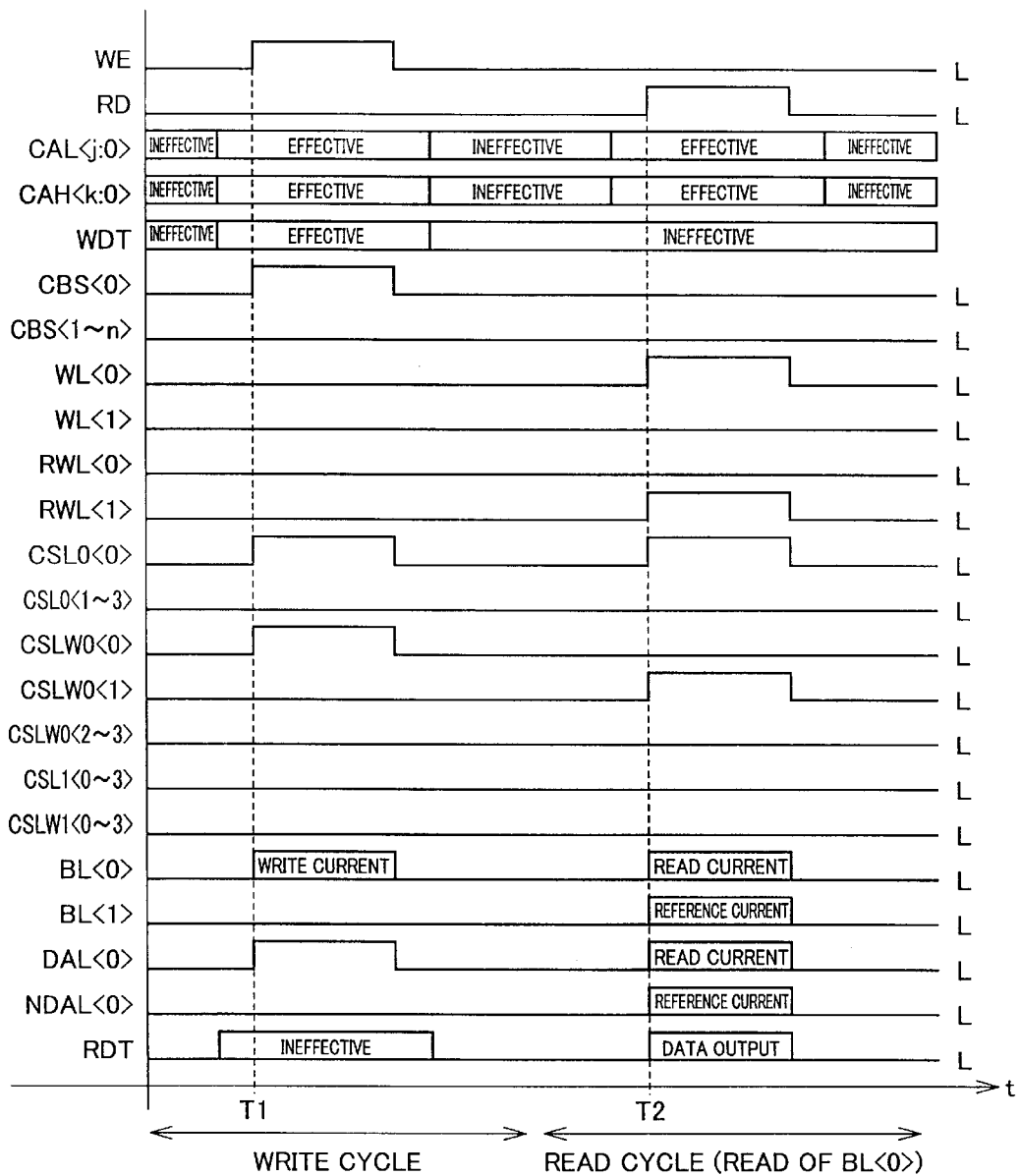
FIG. 29 is a timing chart showing the operation of a column select related circuit according to the first modification of the sixth embodiment of the present invention.
Figure 30:
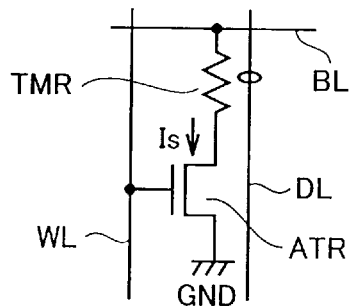
FIG. 30 is a schematic diagram showing the configuration of a memory cell having a magnetic tunnel junction.
Figure 31:
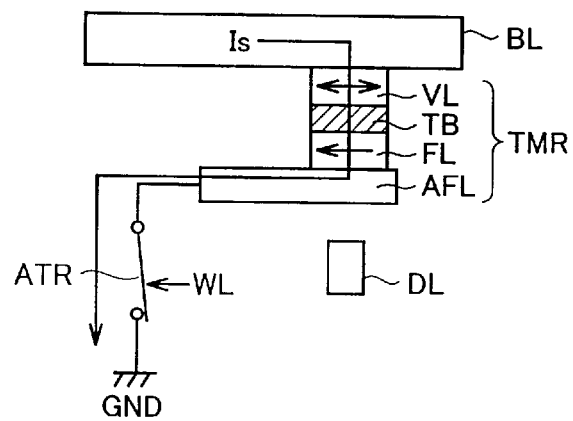
FIG. 31 is a conceptual view for describing a data read operation for reading data from an MTJ memory cell.
Figure 32:
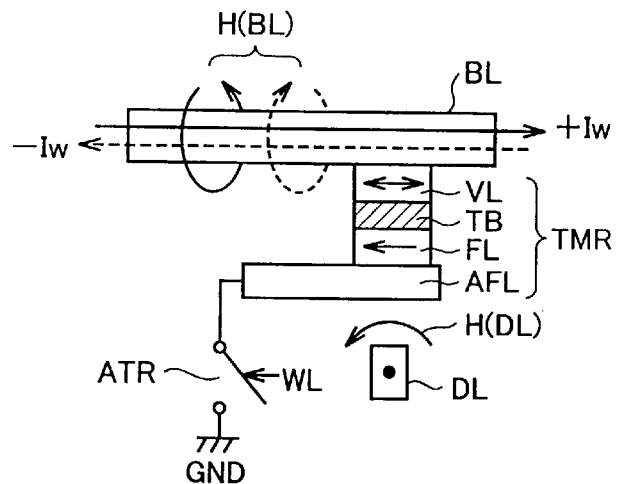
FIG. 32 is a conceptual view for describing a data write operation for writing data to the MTJ memory cell.

Referring to the timing chart of FIG. 29, the operation of the column select related circuit according to the first modification of the sixth embodiment of the present invention will be described.

By way of example, a case of executing a data write operation for writing data to bit line BL<0> of memory block MB0 will be described.

Since the data write operation is the same as that in the sixth embodiment, it will not be repeatedly described herein.

Next, a case of executing a data read operation for reading data from the memory cells corresponding to bit line BL<0> of memory block MB0 will be described.

During data read, column address CA is inputted into row decoder 220. Row decoder 220 selectively activates one of column block select signal CBS in response to high bits of column address CAH at time T2. In this case, column block select signal CBS<0> is set at "H" level. In addition, because of the data read operation, read signal RD is set at "H" level and one read unit RCU is activated. On the other hand, since write enable WE is set at "L" level during data read, driver units DVU are deactivated. In this case, read unit RCU0 is activated in response to column block select signal CBS<0> and read signal RD and read unit RCU0 outputs read data in accordance with the difference in pass current between a data read current and a reference current.

On the other hand, in accordance with row addresses RA<x:0>, decoders DCa and DCb corresponding to selected memory block MB are selected. In this case, decoders DCa<0> and DC#b<0> corresponding to memory block MB0 are selected in accordance with row address RA. Following this selection, decoder DCa<0> selectively activates one of column select lines CSL in response to lower bits of column addresses CAL<j:0>. In this case, decoder DCa<0> activates column select line CSL<0> among column select lines CSL<0> to CSL<3>. In response to the activation of column select line CSL<0>, in block control unit BLTUa<0>, transistor NTa0 is turned on to thereby electrically connect data line DAL<0> to one end side of bit line BL<0>.

Further, decoder DC#b<0> operates in response to the input of read signal RD. During data read, decoder DC#b<0> executes a different column select operation from that during data write. Specifically, if one column select line CSLW corresponding to a bit line in an even-numbered column is activated during data write, a bit line in an odd-numbered column is selected during data write. For example, if decoder DCb<0> activates column select line CSLW0<0> during data write in accordance with lower bits of column addresses CAL<j:0>, decoder DCb<0> activates column select line CSLW0<1> corresponding to the bit line in the odd-numbered column during data read. Accordingly, the other end side of bit line BL<1> is electrically connected to data line NDAL<0>.

At time T2, row decoder 420 selects one word line WL in word line group WLP in response to the inputs of row addresses RA<x:0> and one word line DWL in word line group DWLP in response to column addresses CAL<j:0>. It is assumed herein that word lines WL<0> and RWL<1> are activated.

Following the activation of word lines WL<0> and RWL<1>, memory cell MC corresponding to bit line BL<0> and word line WL<0> is selected. As a result, a current path is formed between memory cell MC and read unit RCU0 through data line DAL<0> and a data read current is supplied from read unit RCU0.

Further, reference memory cell RMCb corresponding to bit line BL<1> and word line RWL<1> is selected. As a result, a current path is formed between memory cell DMCb and read unit RCU0 through data line NDAL<0> and a reference current is supplied from read unit RCU0.

Accordingly, read unit RCU0 outputs read data RDATA to selector SEL in accordance with the current difference between the data read current carried to selected memory cell MC through data line DAL<0> and the reference current carried to reference memory cell DMC through data line NDAL<0>. That is, the data stored in the selected memory cell is read.

Selector SEL outputs read data RDATA received from read unit RCU0 to the outside to.

With the configuration of the column select related circuit according to the present invention, by employing the data line common to the respective bit lines, it is unnecessary to provide a driver for supplying a data write current to correspond to each bit line and it is, therefore, possible to reduce the area of the driver circuit zone. In addition, during data read, it is possible to supply the data read current using the data line common to the respective bit lines. It is, therefore, possible to decrease the number of signal lines, to decrease the number of the parts of the circuit and to reduce the area of the bit line circuit zone.

Furthermore, since reference bit line REFBL can be eliminated, it is possible to further decrease the number of parts compared with the sixth embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A thin film magnetic memory device comprising:

first to $N^{th}$ N (where N is a natural number not smaller than 2) memory blocks each having a plurality of memory cells storing magnetically written data arranged in a matrix, and each sharing columns of a plurality of memory cell columns;

a plurality of bit lines provided to correspond to said plurality of memory cell columns, respectively, and shared among said N memory blocks; and first to $(N+1)^{th}$ (N+1) write control circuits each arranged alternately with each of said memory blocks using regions adjacent in a row direction to each of said memory blocks, wherein each of said (N+1) write control circuits is connected to said plurality of bit lines, and supplies a data write current to a selected bit line of said plurality of bit lines during said data write in accordance with a level of write data, and when the $I^{th}$ memory block of said N memory blocks, where I is a natural number from 1 to N, is selected, each of first to $I^{th}$ write control circuits electrically connects said selected bit line to one of first and second voltages according to said write data and each of $(I+1)^{th}$ to $(N+1)^{th}$ write control circuits electrically connects said selected bit line among said plurality of bit lines to the other one of said first and second voltages according to said write data.

2. The thin film magnetic memory device according to claim 1, further comprising:

a plurality of column select lines provided to correspond to said plurality of memory cell columns, respectively, and shared among said N memory blocks; and an address decoder selectively transmitting a column select result to said plurality of column select lines during said data write, wherein each of said (N+1) write control circuits includes:
   a driver controlling connection between a shared node and one of said first and second voltages according to said write data during said data write; and
   a plurality of switch circuits provided between each of said plurality of bit lines and said shared node, respectively and each turned on in accordance with said column select result of the corresponding column select line.

3. The thin film magnetic memory device according to claim 1, further comprising:

(N+1) decoding circuits provided to correspond to said first to $(N+1)^{th}$ write control circuits, respectively; and
   a plurality of column select lines provided to correspond to said plurality of memory cell columns, respectively, and each transmitting a column select result, wherein
   each of said (N+1) write control circuits has a plurality of driver units provided to correspond to said plurality of bit lines, respectively,
   each of said (N+1) decoding circuits generates a decoding signal based on said write data and a block select result for selecting one of said N memory blocks, and
   each of said driver units controls connection between the corresponding bit line and one of said first and second voltages in accordance with said decoding signal and said column select result.

4. A thin film magnetic memory device comprising:
   a memory array having a plurality of memory cells, each storing magnetically written data, arranged in a matrix;

a plurality of bit lines provided to correspond to a plurality of memory cell columns, respectively;

first and second write control circuits arranged to correspond to both sides of said memory array, respectively, and each supplying a data write current to the selected bit line of said plurality of bit lines during data write, wherein said memory array is divided along a row direction into a plurality of block units, said thin film magnetic memory device further comprises:

a plurality of first and second data lines provided to correspond to said plurality of block units, respectively;

a first address decoder transmitting first and second data signals, complementary to each other in accordance with said write data, to the first and second data lines corresponding to the selected block unit among said plurality of first and second data lines, respectively, said first write control circuit includes a plurality of first write control units provided to correspond to said plurality of block units, respectively, said second write control circuit includes a plurality of second write control units provided to correspond to said plurality of block units, respectively, each of said first write control units has:

a first driver electrically connecting a first shared node provided for each of said first write control units, to one of said first and second voltages in accordance with said first data signal transmitted to the corresponding first data line during said data write; and a plurality of first switch circuits each controlling connection between said first shared node and each of bit lines included in the corresponding block unit, each of said second write control units has:

a second driver electrically connecting a second shared node provided for each of said second write control units, to the other one of said first and second voltages in accordance with said second data signal transmitted to the corresponding second data line during said data write; and a plurality of second switch circuits each controlling connection between said second shared node and each of said bit lines included in the corresponding block unit, and said thin film magnetic memory device further comprises a second address decoder for selectively turning on said plurality of first and second switch circuits in accordance with a column select result.

5. The thin film magnetic memory device according to claim 4, wherein said second address decoder is provided to be common to said plurality of block units, said thin film magnetic memory device circuit comprises:

a plurality of first column select lines provided to correspond to said plurality of first switch circuits, respectively; and a plurality of second column select lines provided to correspond to said plurality of second switch circuits, respectively, each of said first column select lines is provided commonly to be connected to one of said plurality of first switch circuits in respective ones of said plurality of write control units, each of said second column select lines is provided commonly to be connected to one of said plurality of second switch circuits in respective ones of said plurality of write control units, and said second address decoder transmits a column select signal to each of said first and second column select lines in accordance with said column select result.

6. The thin film magnetic memory device according to claim 4, wherein said plurality of block units is divided along a column direction into a plurality of memory blocks, respectively, each of said bit lines is divided to correspond to said plurality of memory blocks in each of said memory cell columns, respectively, said first and second write control circuits are provided for each of said memory blocks, said plurality of first and second data lines are shared among said plurality of memory blocks, said first address decoder is shared among said plurality of memory blocks, and said second address decoder is provided for each of said memory blocks.

7. A thin film magnetic memory device comprising:

a memory array having a plurality of memory cells, each storing magnetically written data, arranged in a matrix, wherein said memory array includes a plurality of bit lines provided to correspond to a plurality of memory cell columns, respectively, said memory array is divided along a row direction into a plurality of block units, respectively, said thin film magnetic memory device further comprises:

a plurality of data line pairs provided to correspond to said plurality of block units, respectively;

a plurality of driver units provided to correspond to said plurality of data line pairs, respectively, and each selectively supplying a data write current to corresponding one of said plurality of data line pairs in accordance with a column select result during data write;

a first connection control circuit provided for each of said data line pairs; and a second connection control circuit provided for each of said data line pairs, each of said data line pairs includes first and second data lines, said first connection control circuit includes a plurality of first switch circuits each controlling connection between one end side of each of the bit lines included in the corresponding block unit and the corresponding first data line, said second connection control circuit includes a plurality of second switch circuits each controlling connection between the other end side of each of the bit lines included in the corresponding block unit and the corresponding second data line, and said thin film magnetic memory device further comprises an address decoder for selectively turning on said plurality of first and second switch circuits in accordance with said column select result.

8. The thin film magnetic memory device according to claim 7, wherein each of said driver units includes a current supply circuit supplying said data write current to said corresponding data line pair, and said current supply circuit electrically connects one of first and second voltages and the other one of the first and second voltages to said corresponding first data line and said corresponding second data line, respectively, in accordance with said column select result and write data.

9. The thin film magnetic memory device according to claim 7, wherein each of said driver unit further includes an amplifier supplying a data read current passing through the selected memory cell during data read for outputting read data in accordance with a current difference between the data read current and a reference current, said amplifier is electrically connected to said corresponding first data line, during said data read, said amplifier supplies said data read current to said corresponding first data line in accordance with a bock select signal and said column select result, and during said data read, said address decoder selectively turns on said plurality of first switch circuits and turns off all of said plurality of second switches in accordance with said column select result.

10. The thin film magnetic memory device according to claim 9, further comprising a reference current supply line supplying said reference current, wherein said reference current supply line is connected to said amplifier included in each of said driver units.

11. The thin film magnetic memory device according to claim 7, wherein each of said block units includes:
  a comparison memory cell row formed from a plurality of comparison cells arranged to share same memory cell columns;
  a plurality of word lines provided to correspond to memory cell rows, respectively; and
  a first comparison word line provided to correspond to the comparison cell in the even-numbered rows among said plurality of comparison cells, a second comparison word line provided to correspond to the comparison cell in the odd-numbered rows among said plurality of comparison cells, said thin film magnetic memory device comprises a row decoder arranged to be common to said block units, and selecting one of said plurality of word lines and one of the first and second comparison word lines in accordance with a row select result, each of said driver units further includes an amplifier supplying a data read current passing through the selected memory cell for outputting read data in accordance with a current difference between said data read current and a reference current during data read, said amplifier is connected to said corresponding first and second data lines, during said data read, if the selected bit line is in the odd-numbered column, said address decoder electrically connects the one end side of said selected bit line to said first data line in accordance with said column select result and electrically connects at least one of the other end sides of the bit lines in the even-numbered columns other than said selected bit line to said second data line in accordance with said column select result, said row decoder activates the word line corresponding to said selected memory cell and said first comparison word line in accordance with the row select result for supplying said data read current, during said data read, if the selected bit line is in the even-numbered column, said address decoder electrically connects the one end side of said selected bit line to said first data line in accordance with said column select result and electrically connects at least one of the other end sides of the bit lines in the odd-numbered columns other than said selected bit line to said second data line in accordance with said column select result, and said row decoder activates the word line corresponding to said selected memory cell and said second comparison word line in accordance with the row select result for supplying said data read current.

* * * * *